US008975729B2

(12) United States Patent
Ramachandran et al.

(10) Patent No.: US 8,975,729 B2
(45) Date of Patent: Mar. 10, 2015

(54) INTEGRATING THROUGH SUBSTRATE VIAS INTO MIDDLE-OF-LINE LAYERS OF INTEGRATED CIRCUITS

(71) Applicant: QUALCOMM Incorporated, San Diego, CA (US)

(72) Inventors: Vidhya Ramachandran, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/724,038

(22) Filed: Dec. 21, 2012

(65) Prior Publication Data

US 2013/0181330 A1    Jul. 18, 2013

Related U.S. Application Data

(60) Provisional application No. 61/586,463, filed on Jan. 13, 2012, provisional application No. 61/671,607, filed on Jul. 13, 2012.

(51) Int. Cl.
*H01L 29/40* (2006.01)
*H01L 21/768* (2006.01)
*H01L 23/48* (2006.01)
*H01L 23/522* (2006.01)

(52) U.S. Cl.
CPC .... *H01L 21/76804* (2013.01); *H01L 21/76898* (2013.01); *H01L 23/481* (2013.01); *H01L 23/5226* (2013.01)
USPC .................. 257/621; 257/774; 257/E23.011; 257/E21.597; 438/667; 438/700

(58) Field of Classification Search
CPC ................. H01L 21/76898; H01L 21/76804; H01L 23/481; H01L 23/5226
USPC .................. 257/621, 774, E23.011, E21.597; 438/667, 700
See application file for complete search history.

(56) References Cited

U.S. PATENT DOCUMENTS

| 7,473,630 | B2 * | 1/2009 | Usami et al. .................. 438/618 |
| 7,816,227 | B2 * | 10/2010 | Chen et al. .................... 438/424 |
| 2007/0184654 | A1 | 8/2007 | Akram et al. |
| 2008/0315418 | A1 | 12/2008 | Boyd et al. |
| 2009/0269905 | A1 * | 10/2009 | Chen et al. .................... 438/424 |

(Continued)

FOREIGN PATENT DOCUMENTS

| EP | 0926726 A1 | 6/1999 |
| EP | 1439576 A2 | 7/2004 |
| EP | 2306506 A1 | 4/2011 |

OTHER PUBLICATIONS

International Search Report and Written Opinion—PCT/US2013/021342—ISA/EPO—Jun. 12, 2013.

(Continued)

*Primary Examiner* — Tu-Tu Ho
(74) *Attorney, Agent, or Firm* — Michelle S. Gallardo

(57) ABSTRACT

A semiconductor wafer has an integrated through substrate via (TSV). The semiconductor wafer includes a substrate. A dielectric layer may be formed on a first side of the substrate. A through substrate via may extend through the dielectric layer and the substrate. The through substrate via may include a conductive material and an isolation layer. The isolation layer may at least partially surround the conductive material. The isolation layer may have a tapered portion.

12 Claims, 21 Drawing Sheets

(56) References Cited

U.S. PATENT DOCUMENTS

2011/0221063 A1  9/2011  Ichinose et al.
2011/0316166 A1  12/2011  Yu et al.

OTHER PUBLICATIONS

Partial International Search Report—PCT/US2013/021342—ISA/EPO—Mar. 28, 2013.

* cited by examiner

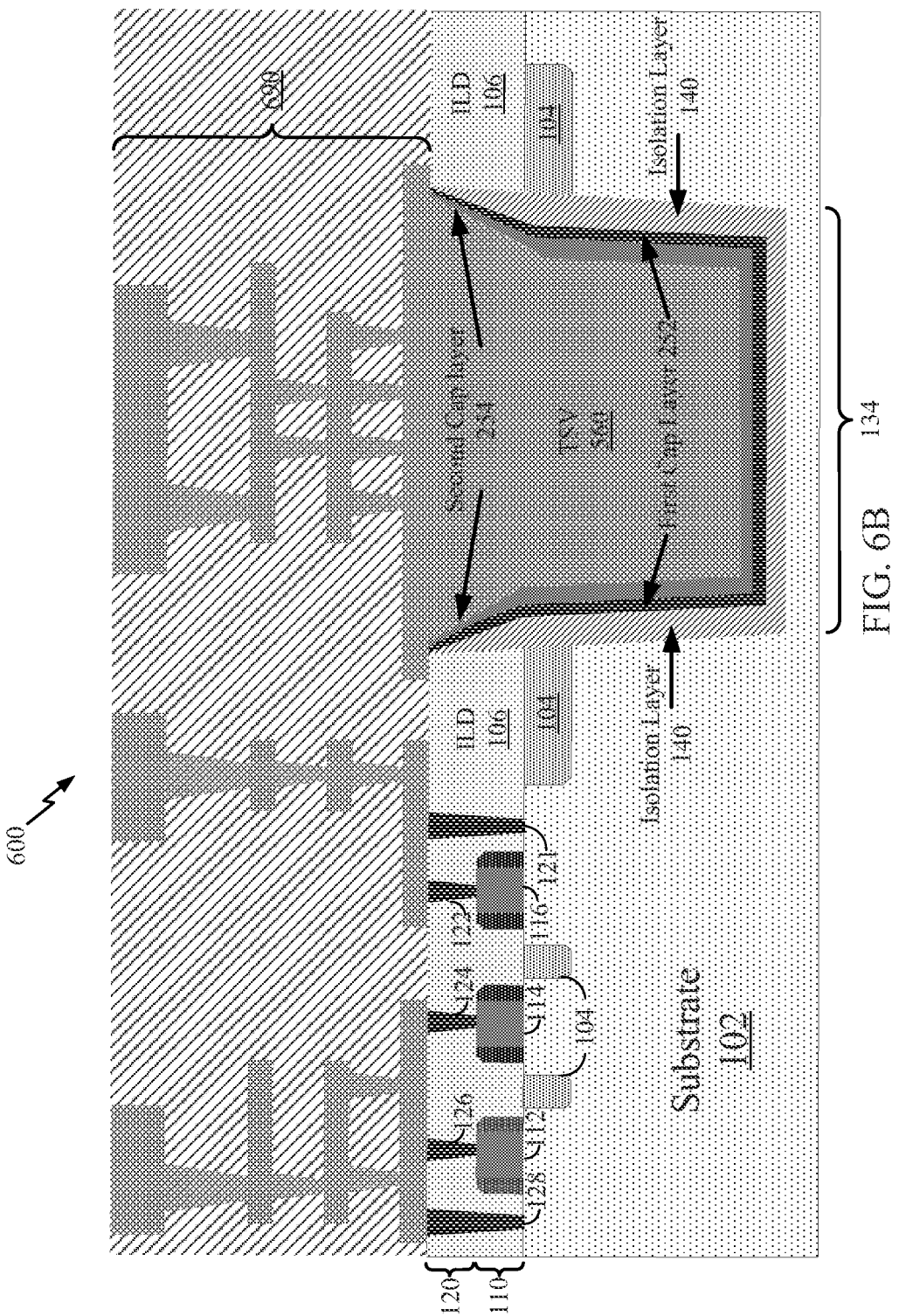

INTEGRATING THROUGH SUBSTRATE VIAS INTO MIDDLE-OF-LINE LAYERS OF INTEGRATED CIRCUITS

RELATED APPLICATIONS

The present application claims the benefit of U.S. Provisional Patent Application No. 61/586,463 filed on Jan. 13, 2012, and U.S. Provisional Patent Application No. 61/671,607 filed on Jul. 13, 2012, in the names of V. Ramachandran et al., the disclosures of which are expressly incorporated by reference herein in their entireties.

TECHNICAL FIELD

The present disclosure generally relates to integrated circuits (ICs). More specifically, the present disclosure relates to integrating through substrate vias (TSVs) into middle-of-line layers in advanced CMOS (complementary metal oxide semiconductor) nodes.

BACKGROUND

The process flow for semiconductor fabrication of integrated circuits (ICs) may include front-end-of-line (FEOL), (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate contact formation. The BEOL processes may include a series of wafer processing steps for interconnecting the semiconductor devices created during the FEOL and MOL processes. Successful fabrication and qualification of modern semiconductor chip products involves an interplay between the materials and the processes employed. In particular, the gate contact formation during the MOL process is an increasingly challenging part of the process flow, particularly for lithography patterning.

As semiconductor nodes advance (i.e., nodes become smaller and fabrication methodology advances), integrating TSVs (through substrate vias) into MOL layers becomes more difficult. Middle of line layers may include, but are not limited to, MOL contacts or other layers within close proximity to the semiconductor device transistors or other like active devices. The proximity of MOL layers to the device transistors results in narrow process window for successfully integrating the TSVs because MOL layers generally exhibit a reduced thickness. As a result, variability of the die/wafer thickness caused by the TSV integration process becomes more significant to the MOL layers because the TSV process creates vertical connections through the body of the semiconductor device. Moreover, the limited size scaling capability of TSVs further increases their impact on the MOL layers.

One TSV process contributing to die and wafer thickness variability is TSV chemical-mechanical polish (CMP) over-polish. Over-polishing is performed to completely remove all the layers (including films) placed on the wafer by the TSV fill process. In particular, the layers placed on the wafer by the TSV fill process may be formed on an MOL layer of the wafer. Unfortunately, layer removal from the wafer due to over-polishing may further reduce the thickness of the MOL layers, especially for a twenty-nanometer (20 nm) or smaller process.

SUMMARY

In one aspect of the disclosure, a semiconductor wafer having an integrated through substrate via (TSV) is described. The semiconductor wafer includes a substrate. A dielectric layer may be formed on a first side of the substrate. A through substrate via may extend through the dielectric layer and the substrate. The through substrate via may include a conductive material and an isolation layer. The isolation layer may at least partially surround the conductive material. The isolation layer may include a tapered portion.

In one aspect of the disclosure, a method for integrating a through substrate via (TSV) into an advanced CMOS (complementary metal oxide semiconductor) node is described. The method includes defining a through substrate via cavity in a substrate including a dielectric layer formed on a first side of the substrate. The method also includes depositing an isolation layer within the through substrate via cavity. The method further includes etching a portion of the isolation layer. The etching may create a tapered portion of the isolation layer that is substantially proximate to the dielectric layer. The method also includes depositing a conductive material in the through substrate via cavity.

In one aspect of the disclosure, a semiconductor wafer having an integrated through substrate via (TSV) is described. The semiconductor wafer includes a substrate. A dielectric layer may be formed on a first side of the substrate. The semiconductor wafer includes means for conducting through the dielectric layer and the semiconductor substrate. The semiconductor wafer also includes means for isolating the conducting means. The isolating means may surround the conducting means. The isolating means may also include a tapered portion.

In another aspect of the disclosure, a method for integrating a through substrate via (TSV) into an advanced CMOS (complementary metal oxide semiconductor) node is described. The method includes defining a through substrate via cavity in a semiconductor substrate. The method also includes depositing an isolation layer within the through substrate via cavity and outside of the through substrate via cavity. The method further includes depositing a photoresist on the through substrate via cavity. The method also includes etching the isolation layer outside of the through substrate via cavity. The method further includes removing the photo-resist that covers the through substrate via cavity. The method also includes filling the through substrate via cavity with a conductive material. The method further includes chemical mechanical over-polishing of the isolation layer outside of the through substrate via cavity to expose middle-of-line layers.

In a further aspect of the disclosure, a semiconductor wafer having an integrated through substrate via (TSV) is described. The semiconductor wafer includes a semiconductor substrate. A dielectric layer may be formed on a surface of the semiconductor substrate. A polish stop layer may be formed on a surface of the dielectric layer. A through substrate via may extend through the polish stop layer, the dielectric layer and the semiconductor substrate. The through substrate via may include a conductive material and an isolation layer. The isolation layer may at least partially surround the conductive material. The isolation layer may also partially cover a portion of the polish stop layer.

In a another aspect of the disclosure, a semiconductor wafer having an integrated through substrate via (TSV) is described. The semiconductor wafer includes a semiconductor substrate. A dielectric layer may be formed on a surface of the semiconductor substrate. A polish stop layer may be formed on a surface of the dielectric layer. The semiconductor wafer includes a means for conducting through the polish stop layer, the dielectric layer, and the semiconductor substrate. The semiconductor wafer includes a means for isolating the conducting means. The isolating means may at least partially surround the conductive material. The isolating means may also partially cover a portion of the polish stop layer.

This has outlined, rather broadly, the features and technical advantages of the present disclosure in order that the detailed description that follows may be better understood. Additional features and advantages of the disclosure are described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 6B shows a cross-sectional view illustrating the IC device of FIG. 5B, following a back-end of line (BEOL) stack fabrication according to one aspect of the disclosure.

DETAILED DESCRIPTION

Figure 1A:
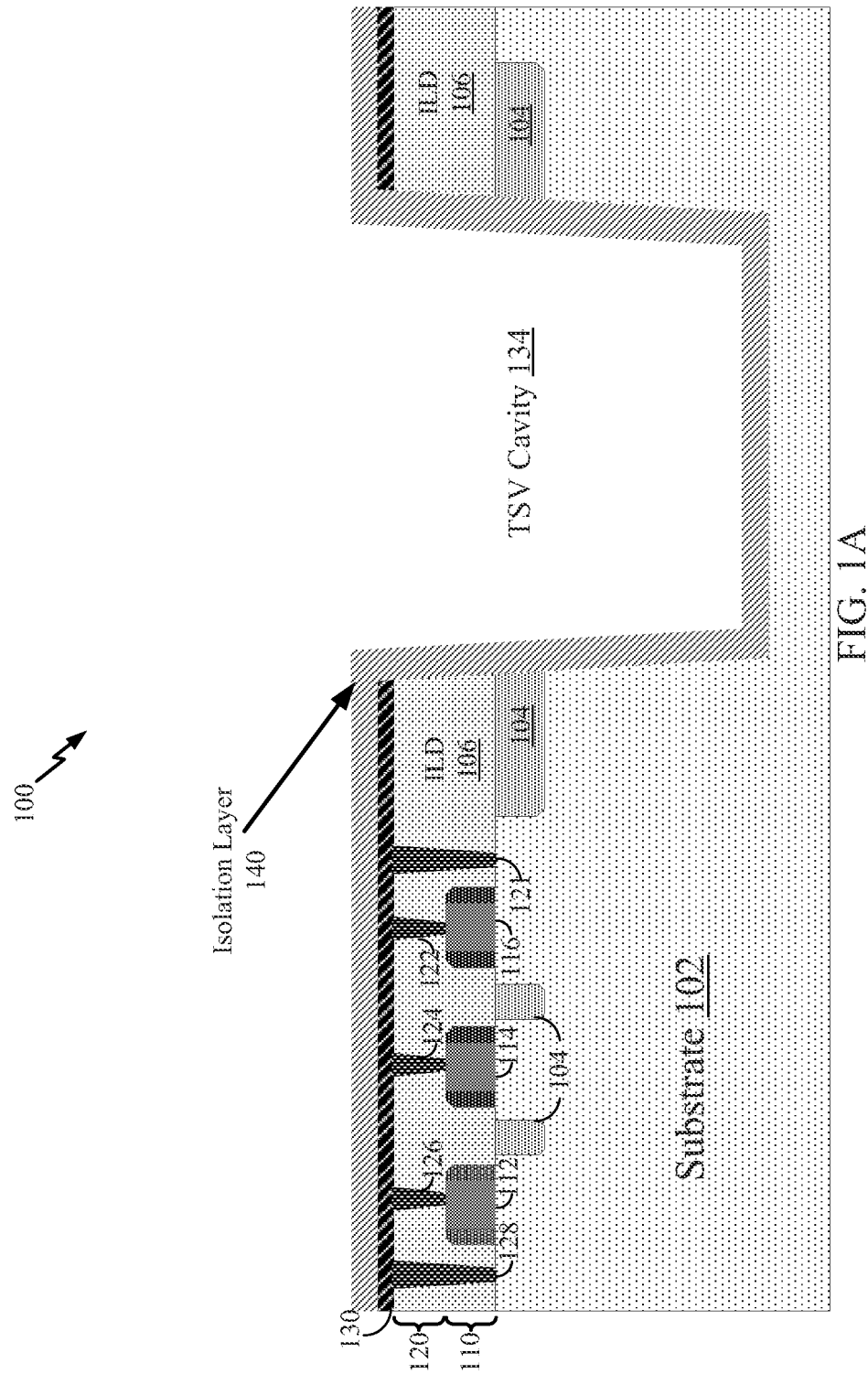
FIG. 1A shows a cross-sectional view illustrating an integrated circuit (IC) device including active devices and an isolation layer according to one aspect of the disclosure.

The detailed description set forth below in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Various aspects of the disclosure provide techniques for integrating through substrate vias (TSVs) into middle-of-line layers in an integrated circuit (IC). The process flow for semiconductor fabrication of integrated circuits (ICs) may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. According to one aspect of the disclosure, an isolation layer separates a conductive portion of a through substrate via (TSV) from a substrate (e.g., silicon) of a wafer and also from an interlayer dielectric layer of the wafer. In one configuration, the isolation layer includes a tapered portion substantially proximate to the dielectric layer of the wafer. The isolation layer also includes a substantially constant portion disposed along a horizontal length of the substrate of the wafer. In another configuration, the isolation layer of the through substrate via has a first portion with a first substantially constant diameter and a second portion with a larger substantially constant diameter. In a further configuration, a multi-film capping separates the insolation layer from a conductive material that fills a through substrate via.

In one aspect of the disclosure, a directional reactive ion (DRI) etch results in a portion of the isolation layer being tapered. In this aspect of the disclosure, the DRI etch substantially removes a portion of the layers from the horizontal surface of the wafer before CMP (chemical mechanical polishing), so that a CMP over-polish removes a reduced amount of the isolation layer. In this aspect of the disclosure, the DRI etch substantially reduces a thickness of the isolation layer formed on the horizontal surface of the wafer prior to a TSV formation process. In another aspect of the disclosure, following the TSV formation process, back-end-of-line (BEOL) interconnect layers are fabricated on the wafer to complete an IC device.

Advantageously, a CMP over-polish, which removes all the layers placed on the wafer during the TSV fill process, is reduced by using the DRI etch. That is, the DRI etch removes most of the layers front the horizontal surface of the wafer, so that less CMP over-polishing process is needed to remove the remaining layers on the wafer (placed during the fill process). The DRI etch also removes some of the layers deposited inside the sidewall of the TSV, creating a tapered isolation layer. The majority of the removal is near the top of the TSV. By reducing CMP over-polishing, the middle-of-line (MOL) layers of the wafer are better preserved/protected during the CMP over polish. The TSV can also be inserted above the MOL layers, such as at a conductive material (e.g., metal) level (e.g., the BEOL interconnect layers).

FIG. 1A shows a cross-sectional view illustrating an integrated circuit (IC) device 100 including active devices 112-116 according to one aspect of the disclosure. Representatively, the IC device 100 includes a substrate (e.g., a silicon wafer) 102 having shallow trench isolation (STI) regions 104. Above the STI regions 104 and the substrate 102 is an interlayer dielectric (ILD) layer 106. Also provided is a front-end of line (FEOL) interconnect layer 110. A middle-of-line (MOL) layer 120 is also provided. The ILD layer 106 protects active devices 112-116 of the FEOL interconnect layer 110 and conductive elements (e.g., vias) 121-128 of the MOL layer 120 from damage by later processing. In this configuration, the ILD layer 106 is formed of a silicon oxide or other like material for preventing shorting between the conductive elements 121-128 of the MOL layer 120. In an alternative configuration, the ILD layer 106 is a low-K dielectric or other like material.

As shown in FIG. 1A, the TSV cavity 134 has an increased size (e.g., a depth of 10-100 microns) for accommodating one or more isolation layers and a TSV (through-substrate via) conductive material according to one aspect of the disclosure. As shown in FIG. 1A, after depositing a polish stop layer 130 on a surface of the ILD layer 106 and on a surface of the MOL layer 120 including conductive elements 121-128, lithography defines a TSV cavity 134 that is slightly larger than an actual, conductive portion of the final TSV (see FIGS. 4 and 5). In this configuration, a size of the TSV is on the order of 1-20 micro-meters (μm). The polish stop layer 130 may be formed of a silicon carbide, silicon nitride, SiCON, or other like protective material.

FIG. 1A shows an isolation layer 140 according to one aspect of the disclosure. In this configuration, an etch and/or lithographic process etches through the ILD layer 106 and the STI regions 104 of the substrate 102. This process forms the TSV cavity 134. After the etch is complete, an isolation deposition forms the isolation layer 140 on the polish stop layer 130, the sidewalls, and the bottom of the TSV cavity 134. The isolation layer 140 may be formed with a layer of unfluorinated silica glass (USG), tetraethyl orthosilicate (TEOS), silicon oxide, silicon nitride, or other like precursor for forming an oxide layer or an electrically isolating film. The isolation layer 140 may have a thickness in the range of 20-1000 nanometers (nm).

Figure 1B:
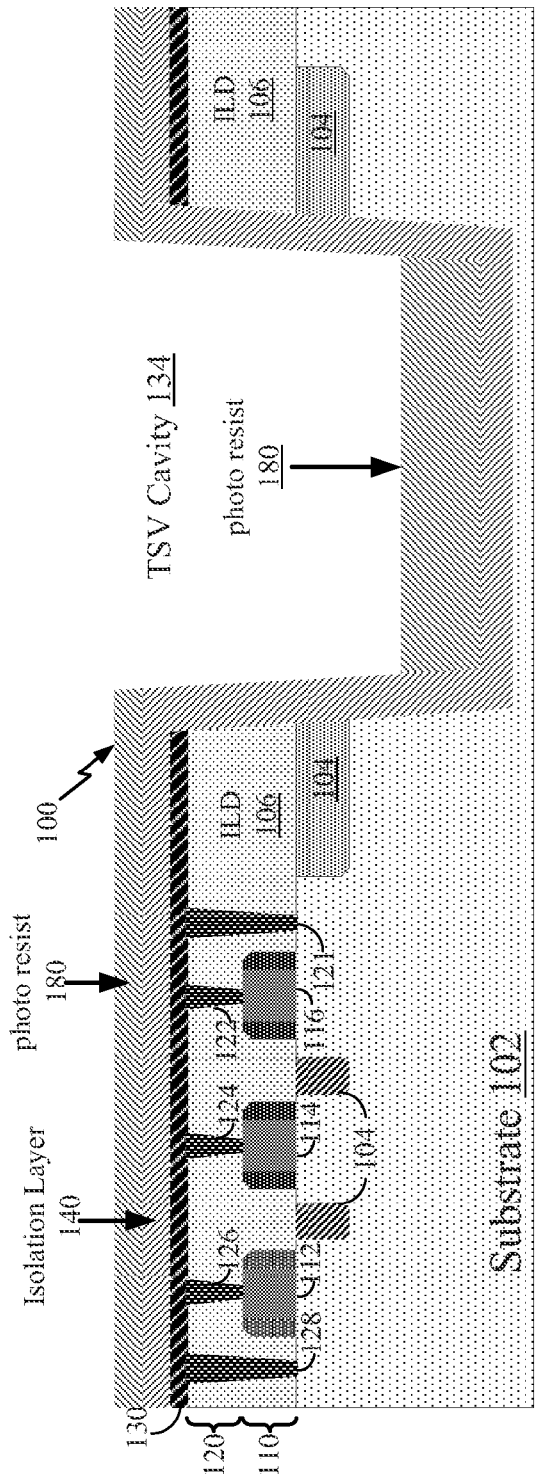
FIGS. 1B and 1C show cross-sectional views illustrating the IC device of FIG. 1A, including a photoresist disposed on the isolation layer according to one aspect of the disclosure.
Figure 1C:
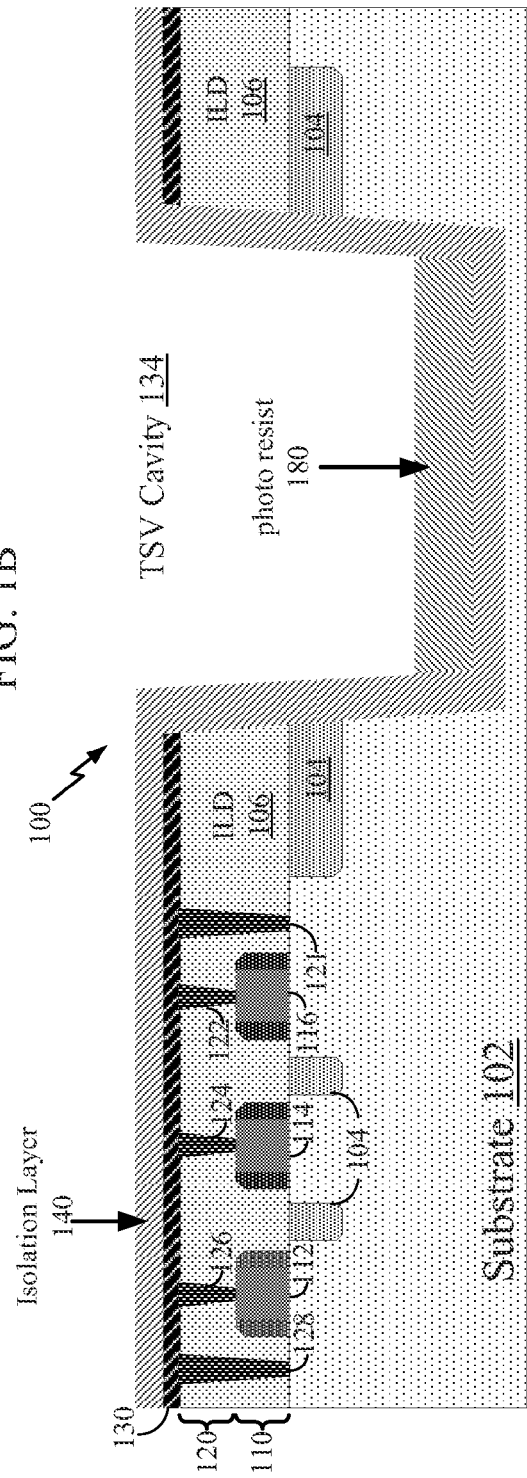

FIGS. 1B and 1C show cross-sectional views illustrating the IC device of FIG. 1A, including a photoresist 180 disposed on the isolation layer 140 according to one aspect of the disclosure. Representatively, the photoresist 180 is deposited on a top surface of the isolation layer 140 that is formed onto the polish stop layer 130. In this configuration, the photoresist 180 is also deposited onto the isolation layer 140 within the TSV cavity 134. A thin layer of the photoresist 180 is disposed on a top portion of the sidewalls of the TSV cavity 134 in this configuration.

FIG. 1C illustrates an etch back process (e.g., an O2 plasma process) to remove the portion of photoresist 180 that is disposed on the top horizontal surface of the isolation layer 140 formed on the polish stop layer 130. In this configuration, the portion of the photoresist 180 that is formed on the isolation layer 140 at the bottom of the TSV cavity 134 is not removed entirely. The photoresist 180 on the top portion of the sidewall of the TSV cavity 134, in this configuration, is entirely removed in this aspect of the disclosure, the photoresist 180 protects the portion of the isolation layer 140 that is disposed onto a bottom portion of the TSV cavity 134. In this configuration, the integrity of the isolation layer 140 disposed onto a bottom portion of the TSV cavity 134 prevents contact between a conductive filler material (see FIGS. 3A-6B) within the TSV cavity 134 and the substrate 102.

Figure 2A:
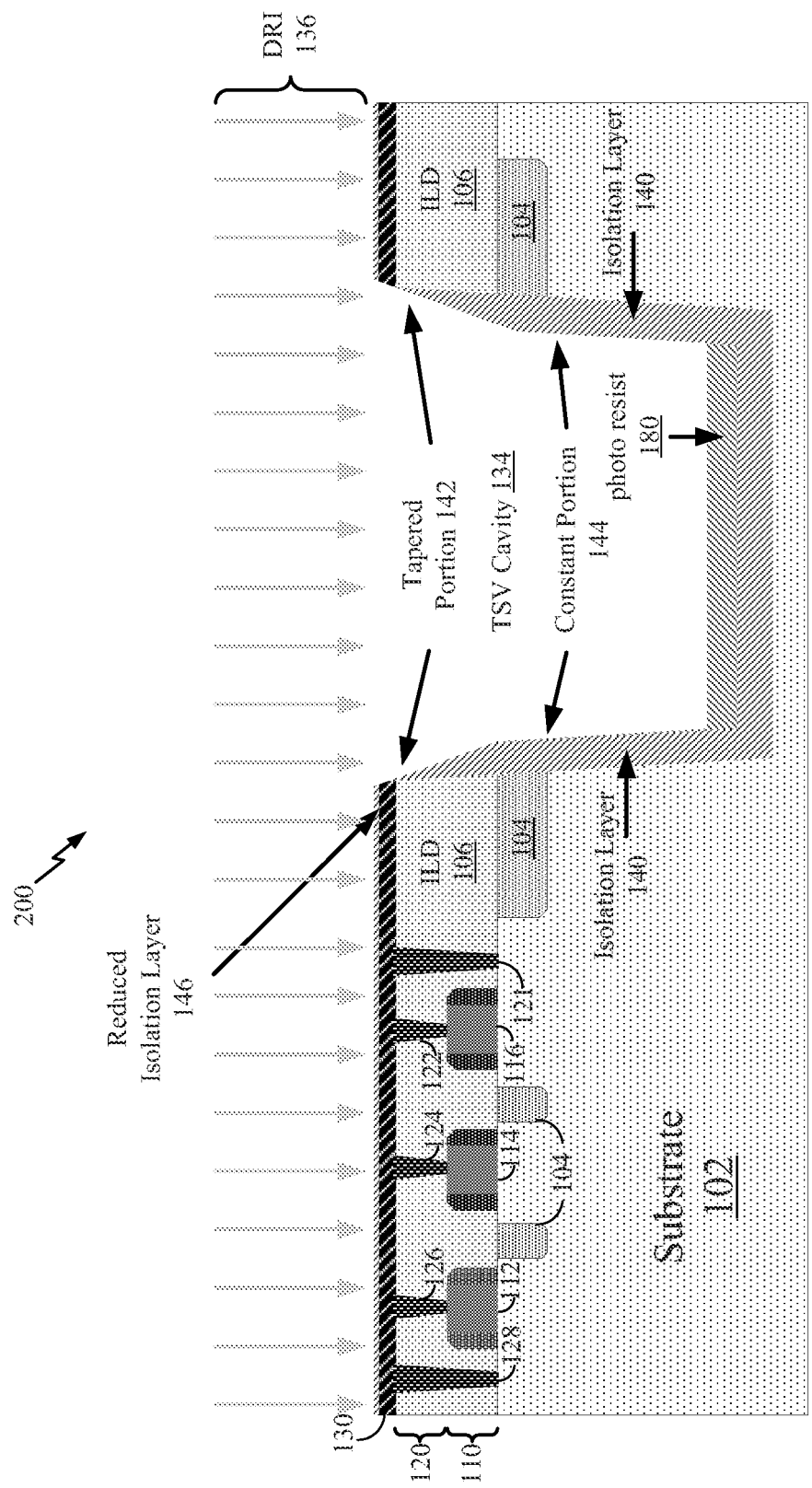
FIG. 2A shows a cross-sectional view of the IC device of FIG. 1C, illustrating etching of the isolation layer to form a tapered portion of the isolation layer according to one aspect of the disclosure.

FIG. 2A shows a cross-sectional view illustrating an IC device 200, including a tapered portion 142 of the isolation layer 140 formed within the TSV cavity 134 according to one aspect of the disclosure. As shown in FIG. 2A, a directional reactive ion (DRI) etch 136 of the isolation layer 140 is performed. The DRI etch 136 reduces a portion of the isolation layer 140 formed over the polish stop layer 130, resulting in a reduced isolation layer 146. Moreover, in this configuration, the DRI etch 136 results in a portion of the isolation layer 140 formed on the sidewalls being tapered as shown in FIG. 2A. In other words, a top-most portion of the isolation layer 140 formed on the side-walls of the TSV (i.e., the portion of the isolation layer 140 on the sidewalls of the TSV which were nearest in proximity to the DRI etching process) have a horizontal width that is reduced relative to the lower portions of the isolation layer 140 formed on the sidewalls of the TSV. The reduction of the horizontal width of a portion of the isolation layer 140 is graduated or tapered.

The tapered profile of the tapered portion 142 of the isolation layer 140 at the top of the TSV cavity 134 may reduce high electrical fields at the TSV top-sharp corners. The length of the tapered portion 142 (e.g., along a vertical axis) of the isolation layer 140 is based on how deep the devices (e.g., the active devices 112-116) extend into the substrate 102, which may be determined according to the transistor technology. It will be understood that the DRI etch 136, does not significantly affect the constant portion 144 (e.g., non-tapered, non-reduced) of the isolation layer 140. Moreover, the photoresist 180 protects the portion of the isolation layer 140 on the bottom of the TSV cavity 134 during the DRI etch 236.

Figure 2B:
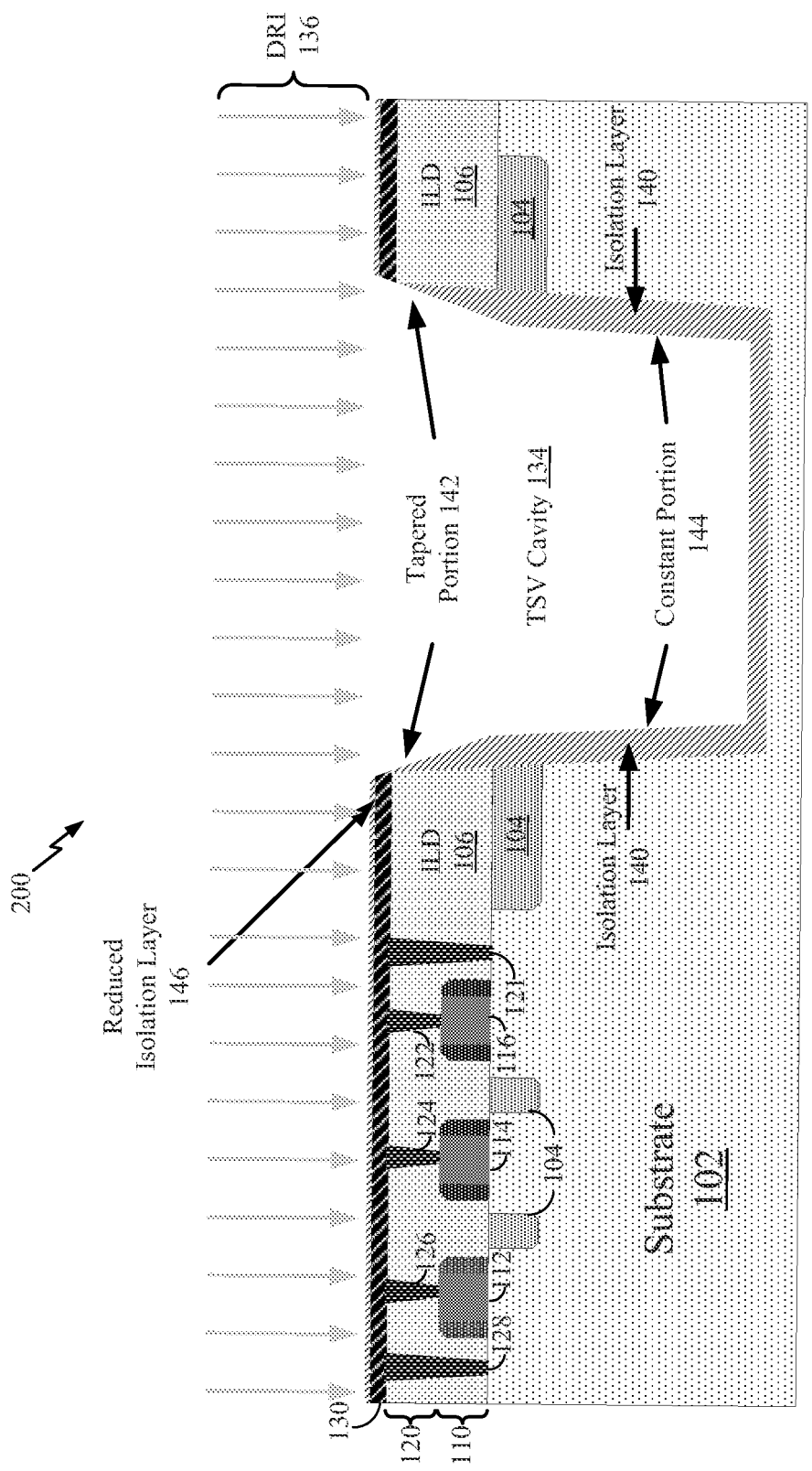
FIG. 2B shows a cross-sectional view of the IC device of FIG. 1A, illustrating etching of the isolation layer to form a tapered portion of the isolation layer according to one aspect of the disclosure.

FIG. 2B shows a cross-sectional view of the IC device 200, illustrating DRI etching of the isolation layer resulting in a portion of the isolation layer 140 being tapered. In this exemplary configuration, the photoresist 180 provided in the exemplary configurations shown in FIGS. 1B, 1C and 2A is not provided. In other words, the exemplary configuration of FIG. 2B is obtained by a process similar to the process which resulted in the exemplary configuration of FIG. 2A; however, the process of adding the photoresist layer 180 is omitted. Because there is no photoresist layer to protect the isolation layer 140 located at the bottom of the TSV cavity 134, that portion of the isolation layer 140 is reduced by the DRI etch 136. In some configurations, the process parameters of the DRI etch 136 are adjusted to prevent the DRI etch 136 from reaching the bottom of the TSV cavity 134. In these configurations, the isolation layer 140 at the bottom of the TSV cavity 136 is protected without the deposition of the photoresist 180.

As shown in FIGS. 2A and 2B, the DRI etch 136 process removes some portion of the isolation layers from horizontal regions on the substrate 102 outside the TSV cavity 134. In FIG. 2B, some portion of the isolation layer 140 inside the TSV cavity 134 is also removed. As shown in FIGS. 2A and 2B, the reduced isolation layer 146 enables a reduction of CMP over-polishing. The CMP over-polishing is later performed to remove the remaining reduced isolation layer 146 and the polish stop layer 130 to expose conductive elements 121-128 of the MOL layer 120 formed by a middle-of-line process. In this aspect of the disclosure, reducing CMP over-polishing lessens the impact on the MOL layer 120 of the substrate 102 because the error (i.e., potential removal of the MOL layers) resulting from etching the reduced isolation layer 146 is generally smaller than the possible error resulting from etching a thicker layer.

Figure 2C:
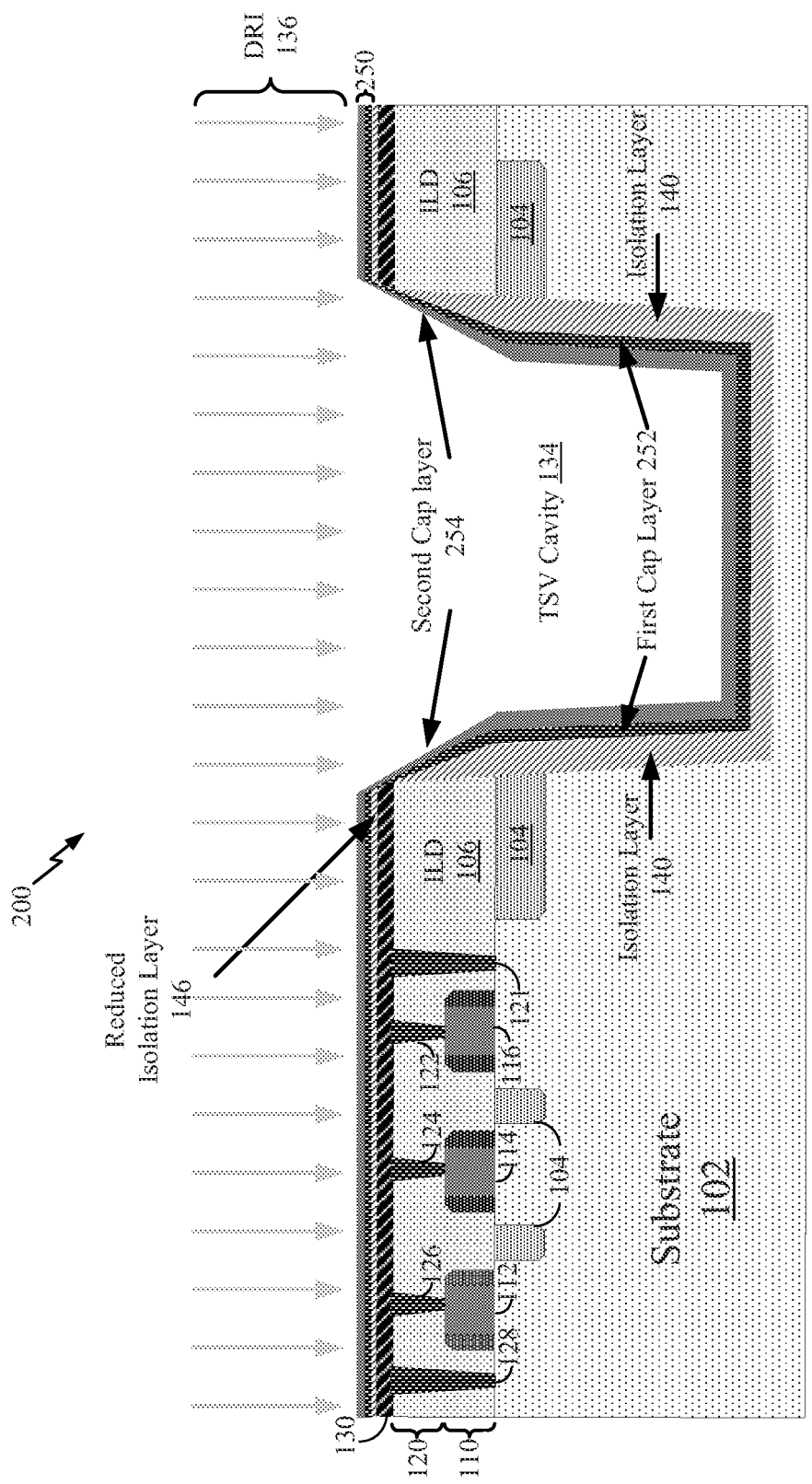
FIG. 2C shows a cross-sectional view of the IC device of FIG. 2B, illustrating the formation of a multi-film capping layer on the isolation layer accord mg to one aspect of the disclosure.

FIG. 2C shows a cross-sectional view of the IC device 200 of FIG. 2B, illustrating the formation of a multi-film capping layer 250 on the isolation layer 140 according to one aspect of the disclosure. Representatively, a capping deposition forms the multi-film capping layer 250 on the isolation layer 140. The multi-film capping layer 250 may be formed by depositing a first cap layer 252 following by a DRI etch 136. The DRI etch 136 reduces a portion of the first cap layer 252 formed over the reduced isolation layer 146. In this configuration, the DRI etch 136 results in a portion of the first cap layer 252 (formed on the sidewalls) being tapered. That is, a top-most portion of the first cap layer 252 formed on the sidewalls of the TSV (i.e., the portion of the first cap layer 252 on the sidewalls of the TSV which were nearest in proximity to the DRI etching process) has a horizontal width which is reduced relative to the bottom portions of the first cap layer 252 formed on the sidewalls of the TSV. The reduction of the horizontal width of a portion of the first cap layer 252 is graduated or tapered.

As further illustrated in FIG. 2C, the capping deposition and DRI etch are repeated to form a second cap layer 254. In this configuration, the top-most portion of the second cap layer 254 formed on the sidewalls of the TSV has a horizontal width which is reduced relative to the bottom portion of the first cap layer 252 formed on the sidewalls of the TSV. Although shown as having two layers, the multi-film capping layer 250 may include any number of films, including a single film. Furthermore, although shown to include tapered portions, the multi-film capping layer 250 may be formed with a constant horizontal width by omitting the DRI etch 136. The multi-film capping layer 250 may be formed using multiple layers of dielectric or conductive films including but not limited to silicon oxide, silicon nitride, silicon carbide, silicon oxynitride, polyimide, or other like insulating films, including titanium nitride, tantalum nitride, tungsten, tantalum, or other like conductive films. The multi-film capping layer 250 may have a thickness in the range of 2-1000 nanometers (nm).

Figure 3A:
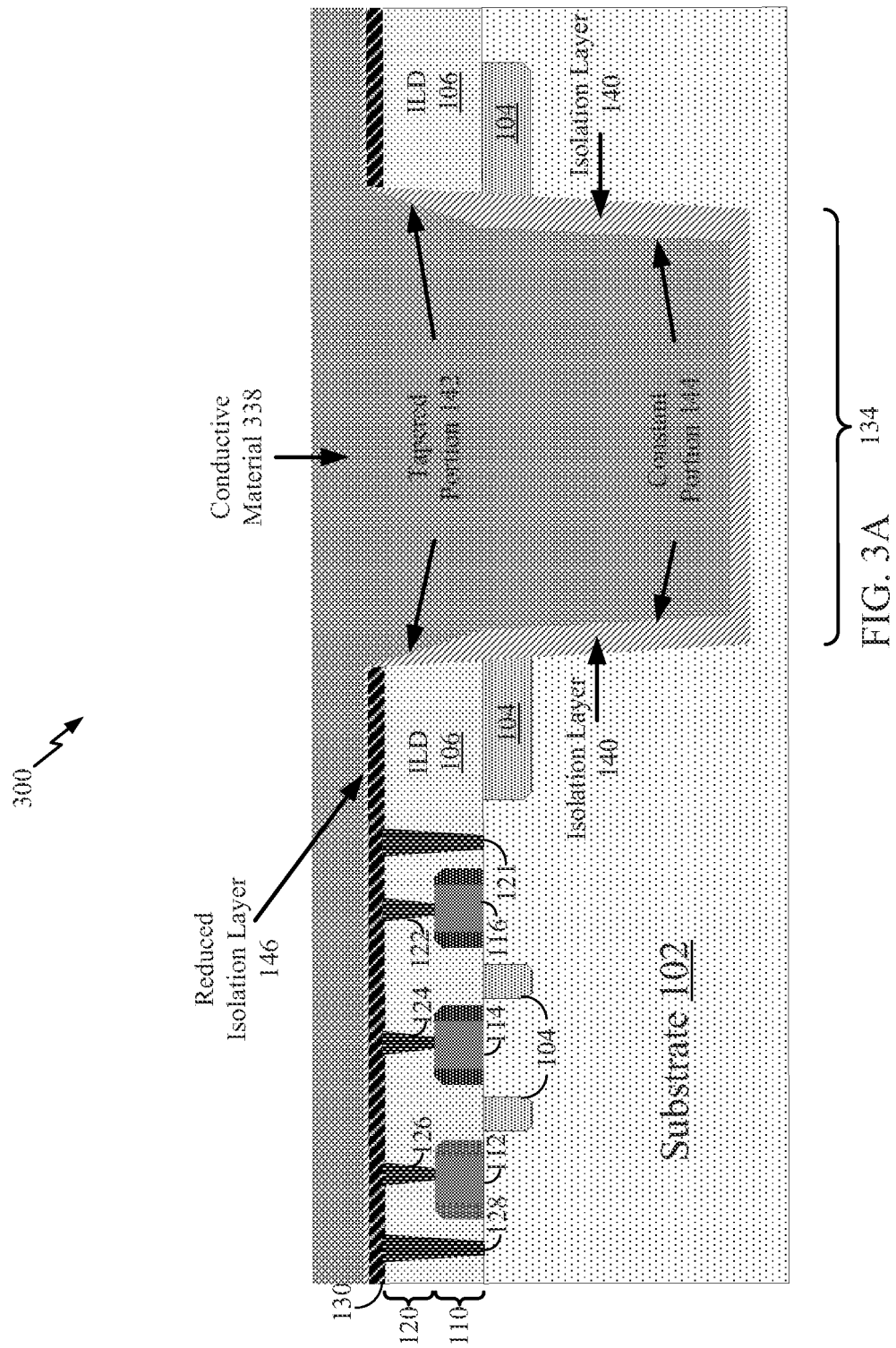
FIG. 3A shows a cross-sectional view illustrating the IC device of FIG. 2B, following a TSV barrier seed and copper fill process according to one aspect of the disclosure.

FIG. 3A shows a cross-sectional view illustrating the IC device 200 of FIG. 2B, following a TSV barrier seed and conductive material fill process according to one aspect of the disclosure. As shown in FIG. 3A, an IC device 300 undergoes a TSV barrier seed and conductive material fill process to deposit a conductive material 338 on the IC device 200. The conductive material 338 shown in FIG. 3A overlays the reduced isolation layer 146 and fills the TSV cavity 134. The tapered portion 112 and the constant portion 144 of the isolation layer 110 prevent the filler material within the TSV cavity 131 from contacting the substrate 102. The conductive material 338 may include, but is not limited to, copper, tungsten, or other like conductive material. Although not shown, a photoresist may remain over the portion of the isolation layer 110 located at the bottom portion of the TSV cavity 134; or it may be removed prior to the TSV cavity 131 with conductive material.

Figure 3B:
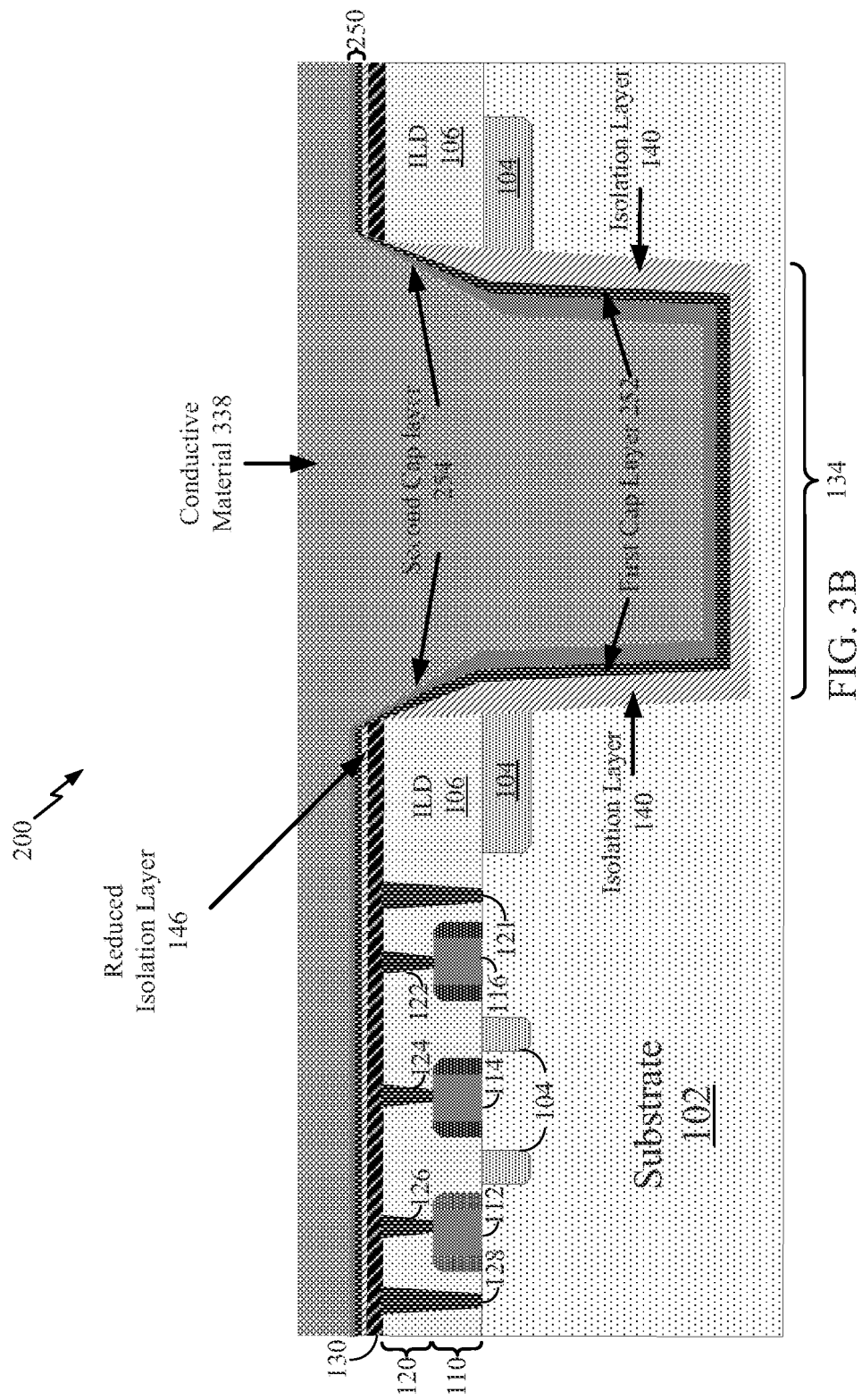
FIG. 3B shows a cross-sectional view illustrating the IC device of FIG. 2C, following a TSV barrier seed and copper fill process according to one aspect of the disclosure.

FIG. 3B shows a cross-sectional view illustrating the IC device 200 of FIG. 2C, following a TSV barrier seed and copper fill process according to one aspect of the disclosure. As shown in FIG. 3B, the IC device 300 undergoes a TSV barrier seed and conductive material fill process to deposit a conductive material 338 on the IC device 200. The conductive material 338 shown in FIG. 3A overlays the multi-film capping layer 250 on the reduced isolation layer 116 and fills the TSV cavity 134 including the first cap layer 252 and the second cap layer 254 on the isolation layer 140.

Figure 4A:
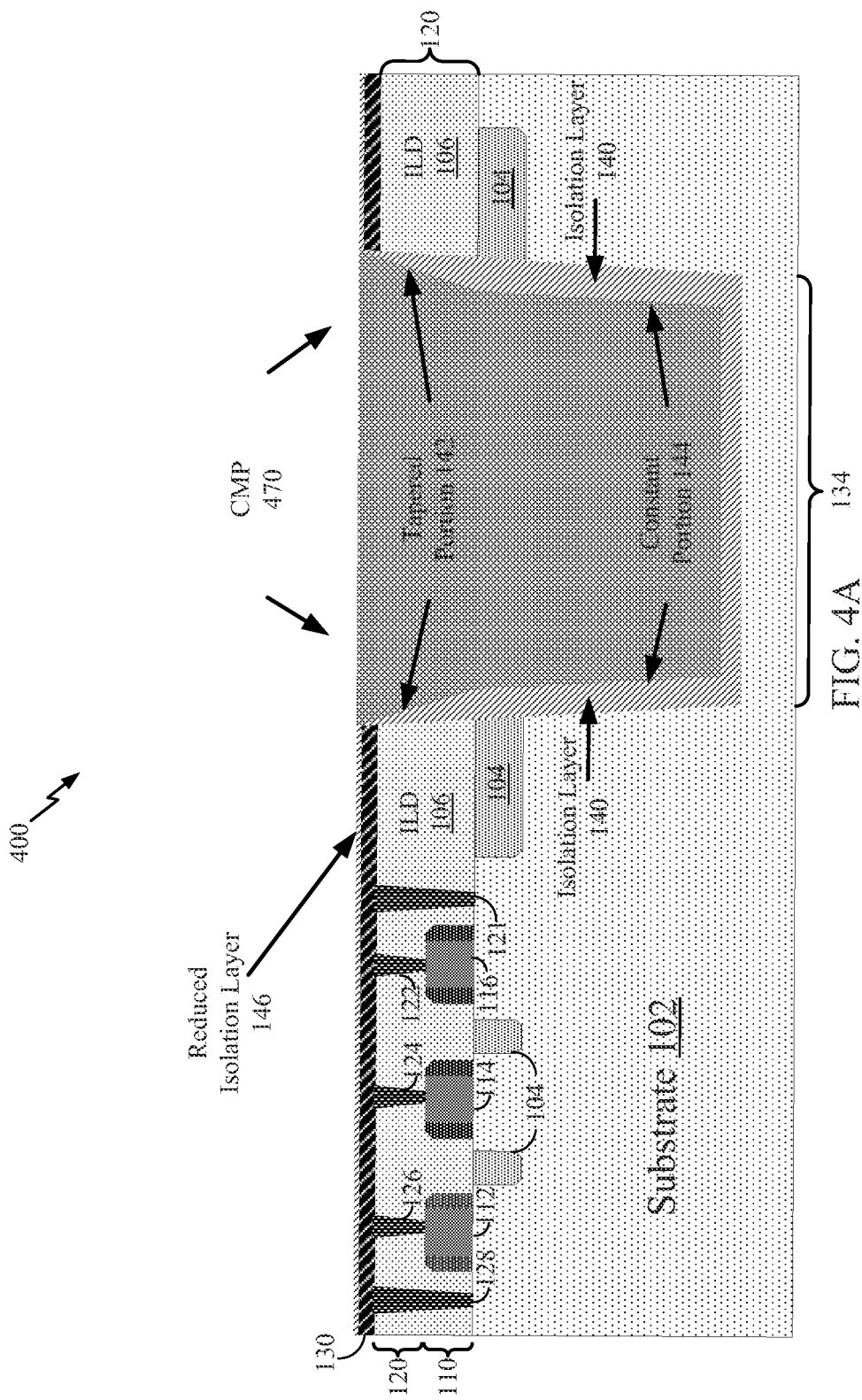
FIG. 4A shows a cross-sectional view illustrating the IC device of FIG. 3A, following a copper chemical mechanical polish (CMP) process according to one aspect of the disclosure.

FIG. 4A shows a cross-sectional view illustrating an IC device 100, after a chemical mechanical polish (CMP) process 470 is applied to the IC device 300 of FIG. 3A and according to one aspect of the disclosure. As shown in FIG. 4A, the CMP process 170 removes the conductive material 338 from a surface of the substrate 102. For example, the CMP process 470 removes the conductive material 338 located over the polish stop layer 130, shown in FIG. 3A. As shown in FIG. 4A, the reduced isolation layer 146 and the polish stop layer 130 remain on a surface of the substrate 102 after the CMP process 470. These layers are removed by a CMP over-polishing process, for example, as shown in FIG. 5A.

Figure 4B:
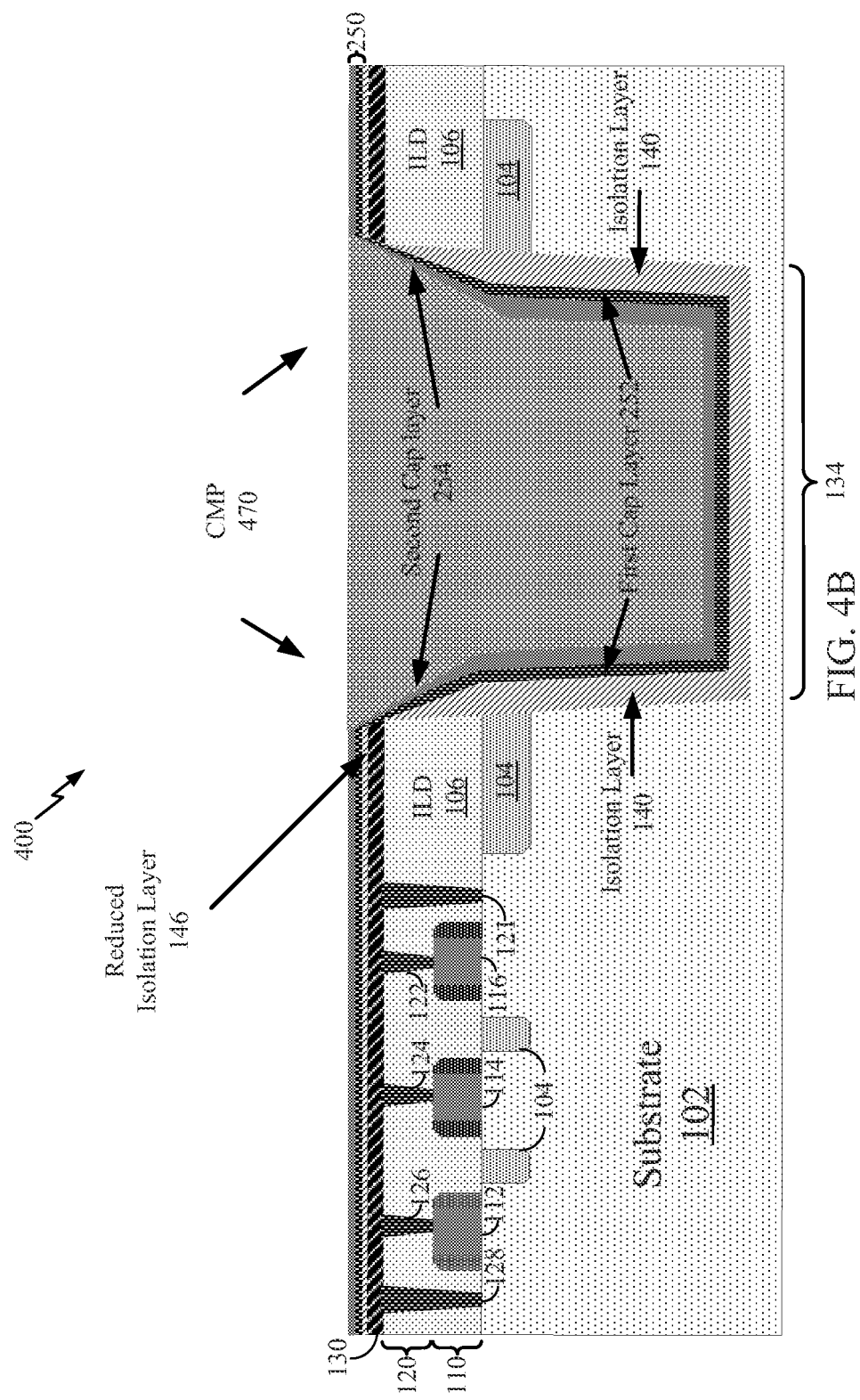
FIG. 4B shows a cross-sectional view illustrating the IC device of FIG. 3B, following a copper chemical mechanical polish (CMP) process according to one aspect of the disclosure.

FIG. 4B shows a cross-sectional view illustrating an IC device 400, after a chemical mechanical polish (CMP) process 470 is applied to the IC device 300 of FIG. 3B according to one aspect of the disclosure. As shown in FIG. 4B, the CMP process 470 removes the conductive material 338 from a surface of the substrate 102. For example, the CMP process 470 removes the conductive material 338 located on the multi-film capping layer 250 over the reduced isolation layer 146, as shown in FIG. 3B. As shown in FIG. 4B, a reduced portion of the multi-film capping layer 250, the reduced isolation layer 146, and the polish stop layer 130 remain on a surface of the substrate 102 after the CMP process 470. These layers are removed by a CMP over-polishing process, for example, as shown in FIG. 5B.

Figure 5A:
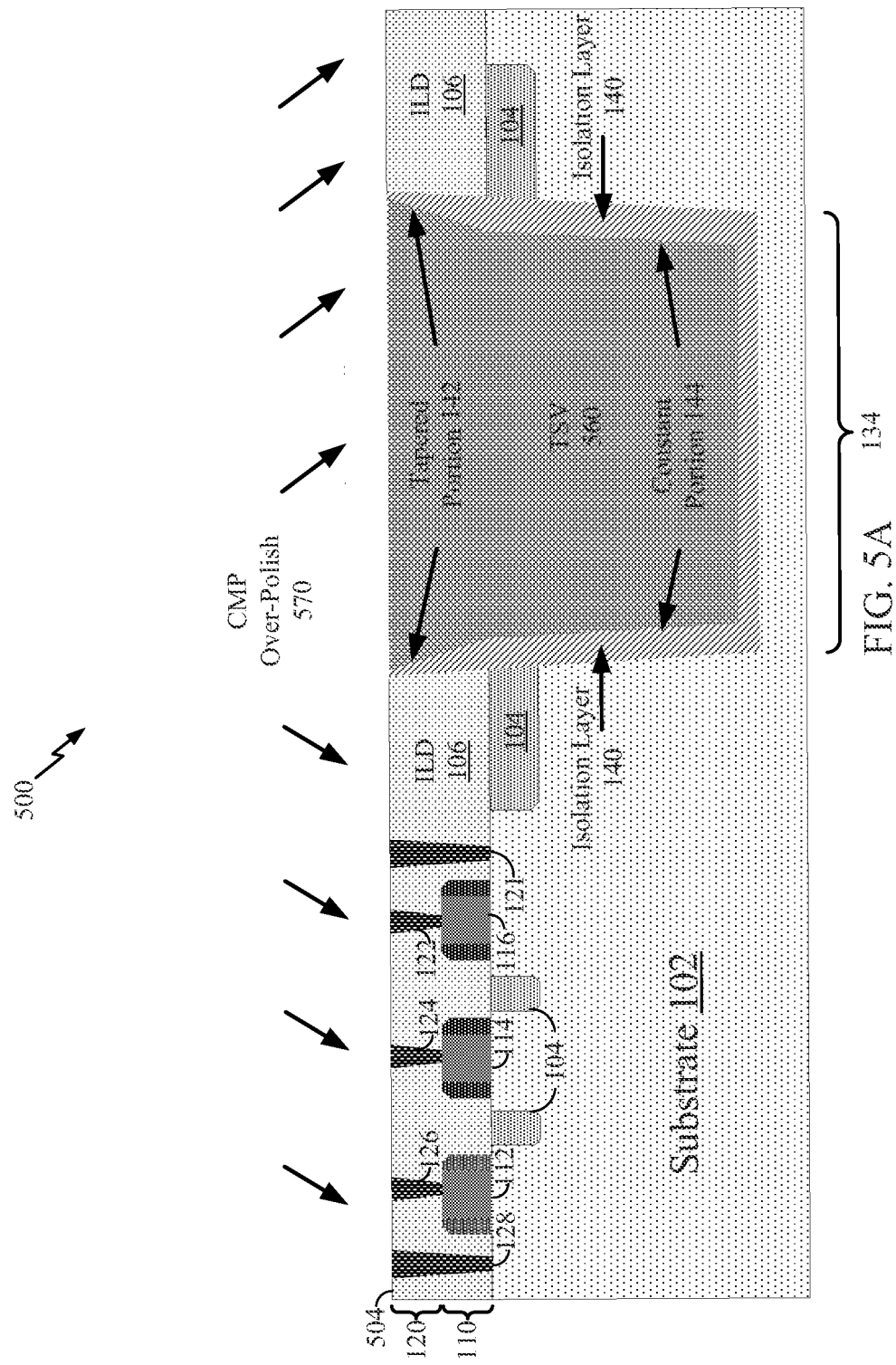
FIG. 5A shows a cross-sectional view illustrating the IC device of FIG. 4A, with a TSV surrounded by an isolation layer having a tapered portion near an active face of the IC device according to one aspect of the disclosure.

FIG. 5A shows a cross-sectional view illustrating an IC device 500, including a TSV 560 surrounded by an isolation layer 140 according to one aspect of the disclosure. As shown in FIG. 5A, a CMP over-polish process 580 removes the remaining portion of the layer on a surface 504 of the substrate 102 to expose the conductive elements 121-128 of the MOL layer 120. For example, the CMP over-polish process 580 removes the reduced isolation layer 146 and the polish stop layer 130 (see FIG. 4A) without damaging the conductive elements 121-128 of MOL layer 120 of the substrate 102. That is, the duration of the CMP over-polish process 580 is shorter and, therefore, has a smaller impact on the underlying MOL layer 120 of the substrate 102 due to the reduced isolation layer 146, as shown in FIGS. 2A-4B.

Figure 6A:
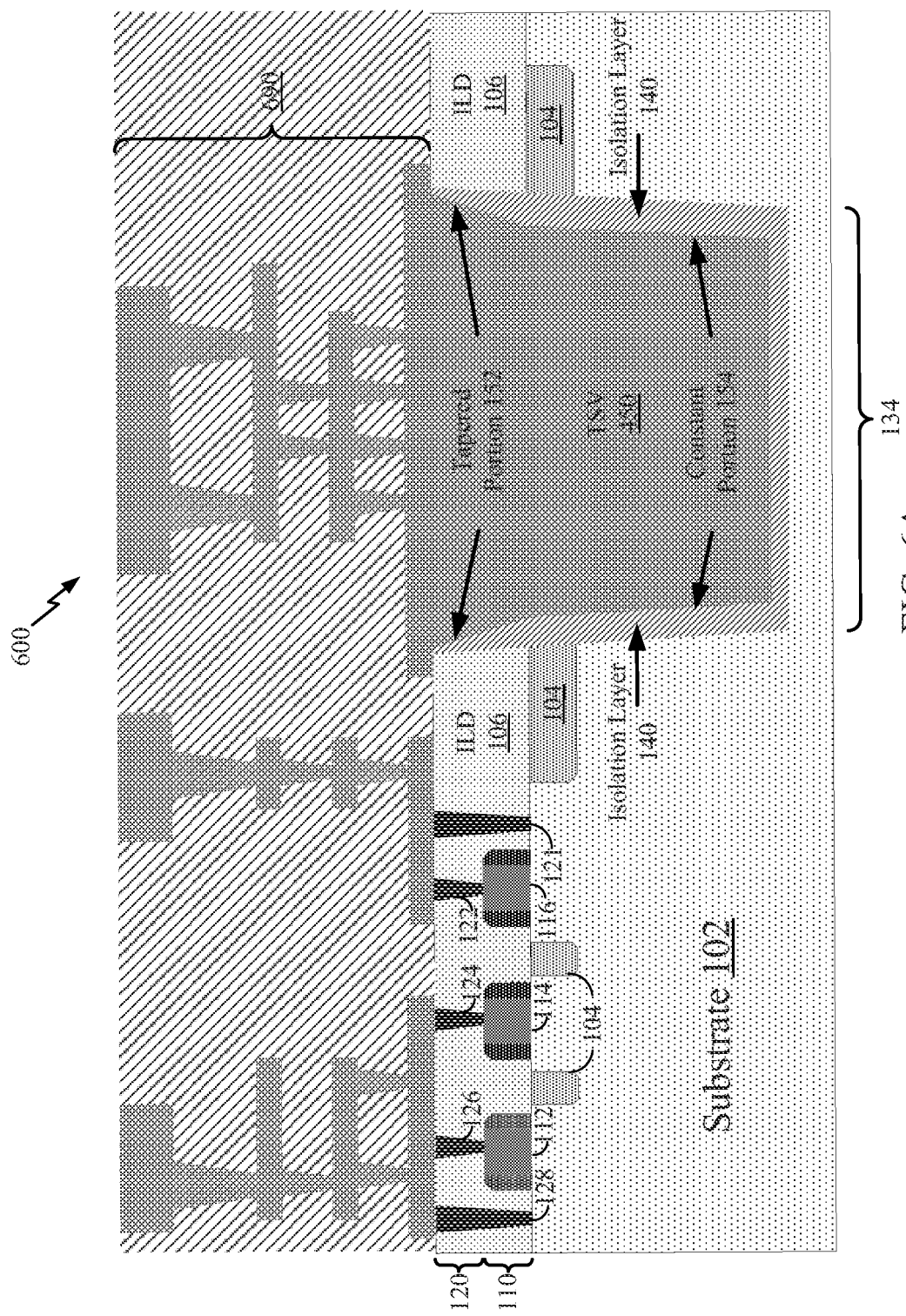
FIG. 6A shows a cross-sectional view illustrating the IC device of FIG. 5A, following a back-end of line (BEOL) stack fabrication according to one aspect of the disclosure.

As shown in FIG. 5A, the CMP over-polish process 580 completes the formation of a TSV 560, in which the conductive material of the TSV 560 varies in diameter according to a tapered portion 142 and a constant portion 144 of the isolation layer 140 within the TSV cavity 134. Representatively, the CMP over-polish process 580 is performed to remove reduced isolation layer 146 and the polish stop layer 130 (see FIG. 4A) in preparation for the formation of a back-end of line interconnect layer, as shown in FIG. 6A. In this aspect of the disclosure, the substrate 102 is subjected to a process (e.g., grinding) for revealing the TSV 560 away from the ILD layer 106.

Figure 5B:
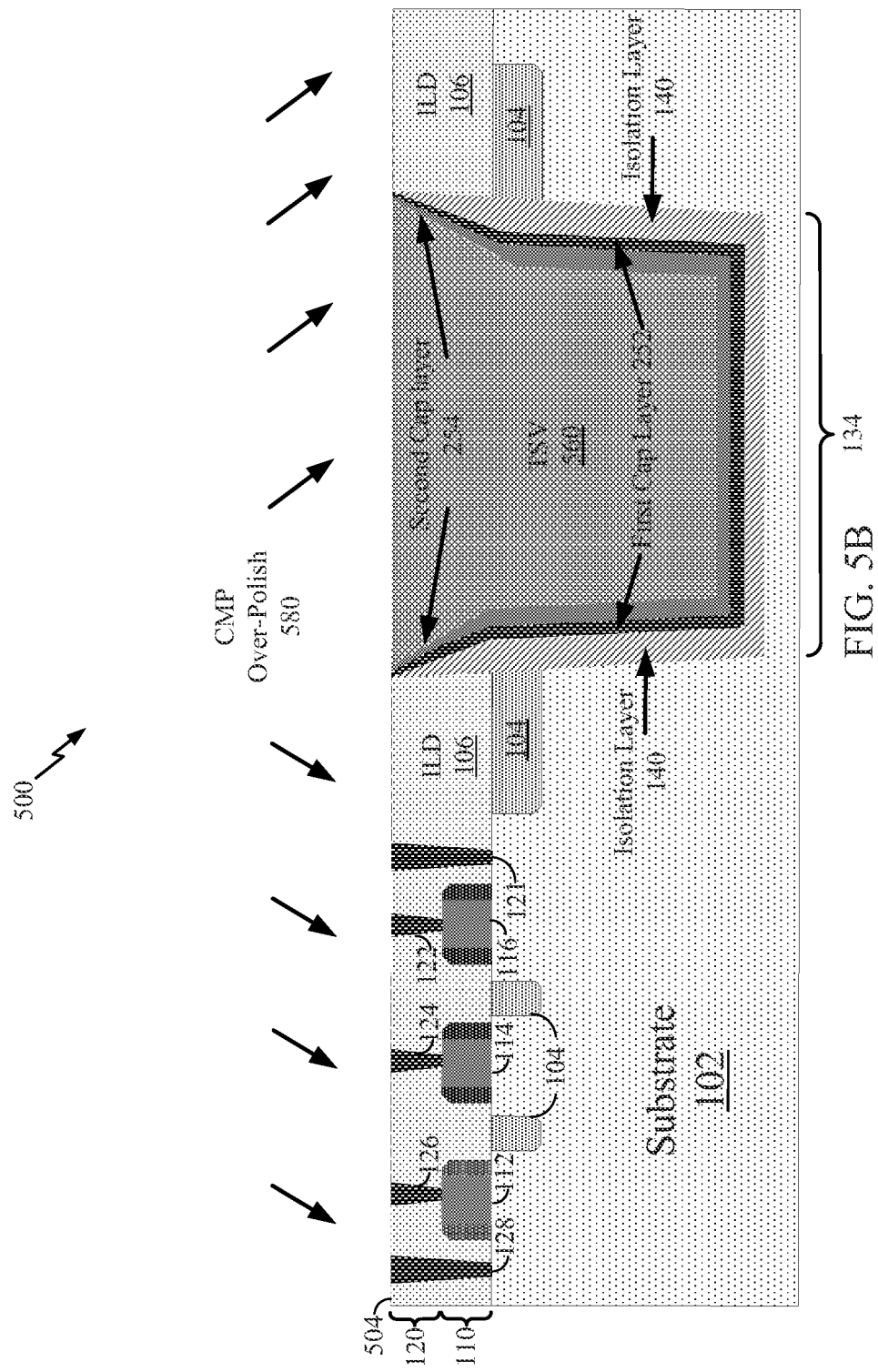
FIG. 5B shows a cross-sectional view illustrating the IC device of FIG. 4C, with a TSV surrounded by a multi-film capping layer on an isolation layer having a tapered portion near an active face of the IC device according to one aspect of the disclosure.

FIG. 5B shows a cross-sectional view illustrating the IC device 400 of FIG. 4B, with a TSV 560 surrounded by a multi-film capping layer 250 on an isolation layer 140 having a tapered portion near an active face of the IC device 500 according to one aspect of the disclosure. Representatively, the CMP over-polish process 580 is performed to remove the multi-film capping layer 250, the reduced isolation layer 146, and the polish stop layer 130 (see FIG. 4B) in preparation for the formation of a back-end of line interconnect layer, as shown in FIG. 6B.

FIG. 6A shows a cross-sectional view illustrating an IC device 600, following a hack-end of line (BEOL) process used to fabricate the interconnect layers according to one aspect of the disclosure. Representatively, after TSV processing is complete, interconnect layers 690 are fabricated on the substrate 102 by the BEOL, process to complete the formation of the IC device 600. In this configuration, the interconnect layers 690 are formed to include a contact level. Additional or alternate interconnect layers may be formed by the BEOL process. The interconnect layers 690 provide a mechanism to electrically and/or thermally couple the IC device 600 to another IC device (not shown).

FIG. 6B shows a cross-sectional view illustrating the IC device 500 of FIG. 5B, following a back-end of line (BEOL) stack fabrication to form an IC device 600. In this configuration, the IC device 600 includes a TSV 560 surrounded by a multi-film capping layer 250 on an isolation layer 140 having a tapered portion near an active face of the IC device 500 according to one aspect of the disclosure. The interconnect layers 690 provide a mechanism to electrically and/or thermally couple the IC device 600 to another IC device (not shown).

Figure 7:
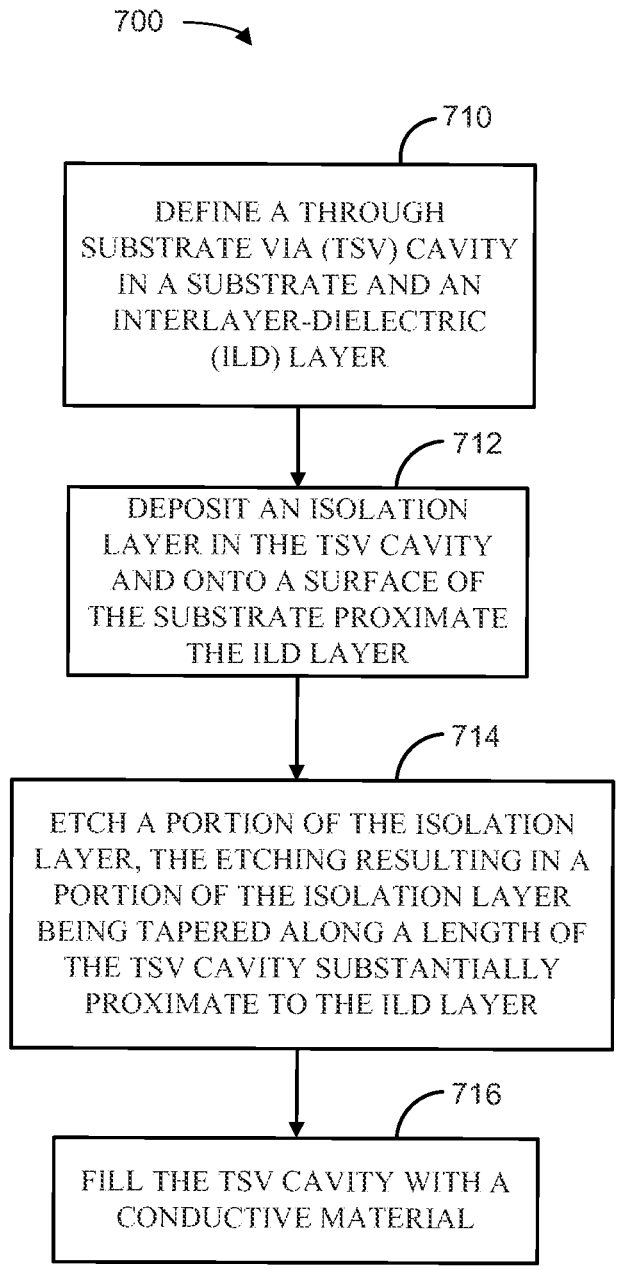
FIG. 7 is a block diagram illustrating a method for integrating through substrate vias (TSVs) into advanced CMOS (complementary metal oxide semiconductor) nodes, according to one aspect of the disclosure.

FIG. 7 is a block diagram illustrating a method 700 for integrating through substrate vias (TSVs) into advanced CMOS (complementary metal oxide semiconductor) nodes, according to one aspect of the disclosure. At block 710, a TSV cavity 134 is defined through a substrate and a dielectric layer (e.g., an interlayer dielectric (ILD)) on the substrate, for example, as shown in FIGS. 1A-5B. Although the present description has mentioned a silicon substrate, other substrate materials are also contemplated including glass, sapphire or any other suitable materials. At block 712, an isolation layer is deposited in the TSV cavity and on a polish stop layer, for example, as shown in FIGS. 1A-1C.

Referring again to FIG. 7, at block 714, the isolation layer is etched to remove the portions of the isolation layer located above the active devices (for example the portion of isolation layer located over the stop polish layer is removed). The etching results in a portion of the isolation layer being tapered. For example, as shown in FIGS. 2A and 2B, a directional reactive ion (DRI) etching of the isolation layer 140 creates tapered portion 142 of the isolation layer 140 on a sidewall of the TSV cavity 134. At block 716, the TSV cavity 134 is filled with a conductive material, for example, as shown in FIGS. 2A-5B. Although the present description has mentioned a copper filler, other conductive materials are also contemplated.

In one configuration, the IC device 600 including a means for conducting through a dielectric layer and the substrate. The conducting means has a conductive filler material. In one aspect of the disclosure, the conducting means is the TSV 560 of FIGS. 5A-6B, configured to perform the functions recited by the conducting means. In this configuration, the IC device 600 also includes a means for isolating the conducting means from the substrate. The means for isolating may surround the conductive material and includes a tapered portion substantially proximate to the ILD layer. In one aspect of the disclosure, the isolating means is the isolation layer 140, including the tapered portion 142 and the constant portion 144 of FIGS. 4A-6B, configured to perform the functions recited by the isolating means. In another aspect, the aforementioned means may be a device or any layer configured to perform the functions recited by the aforementioned means.

Figure 8:
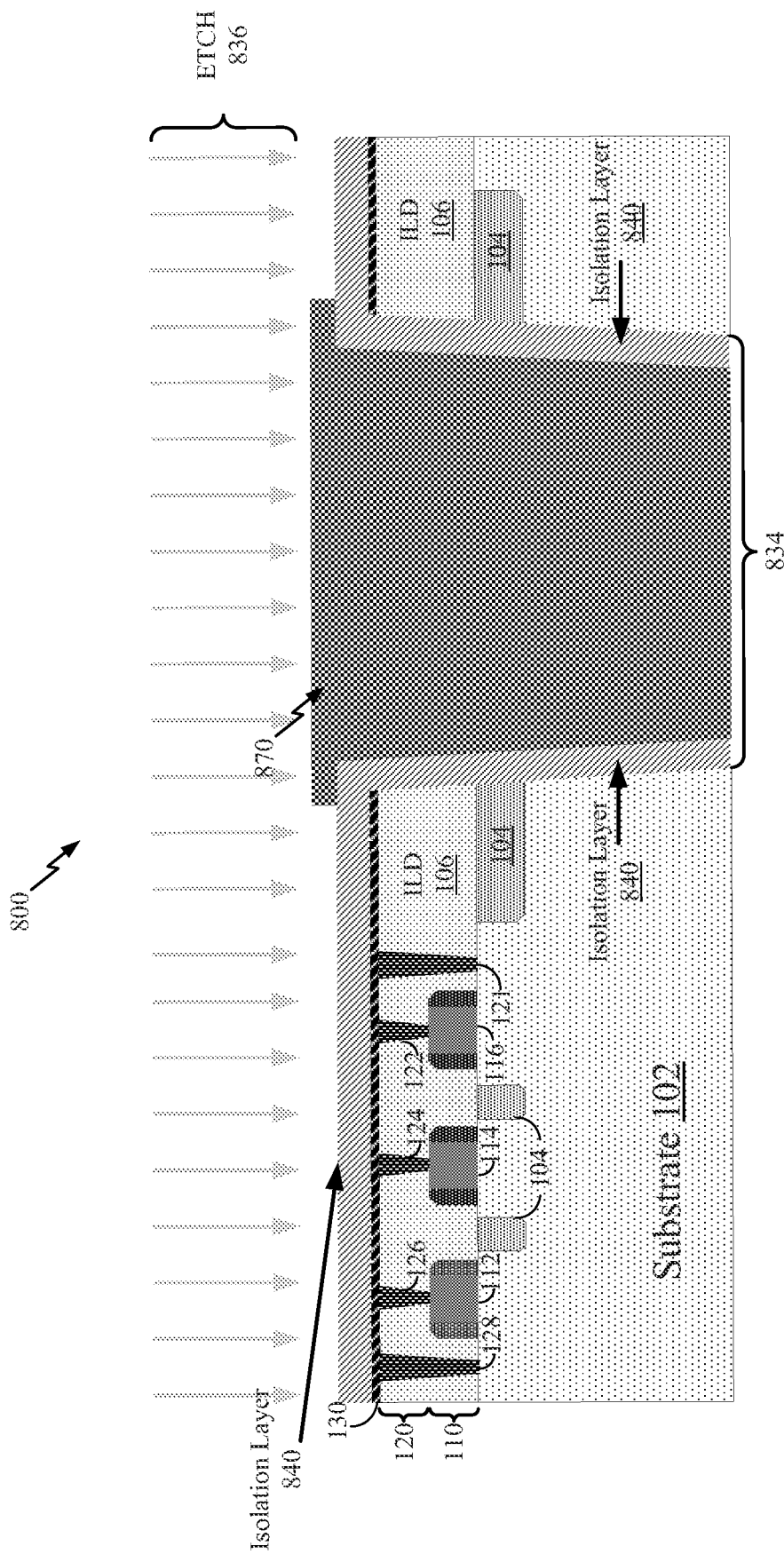
FIG. 8 shows a cross-sectional view of the IC device of FIG. 1A, illustrating a strip resist formed over and within a TSV cavity according to one aspect of the disclosure.
Figure 9:
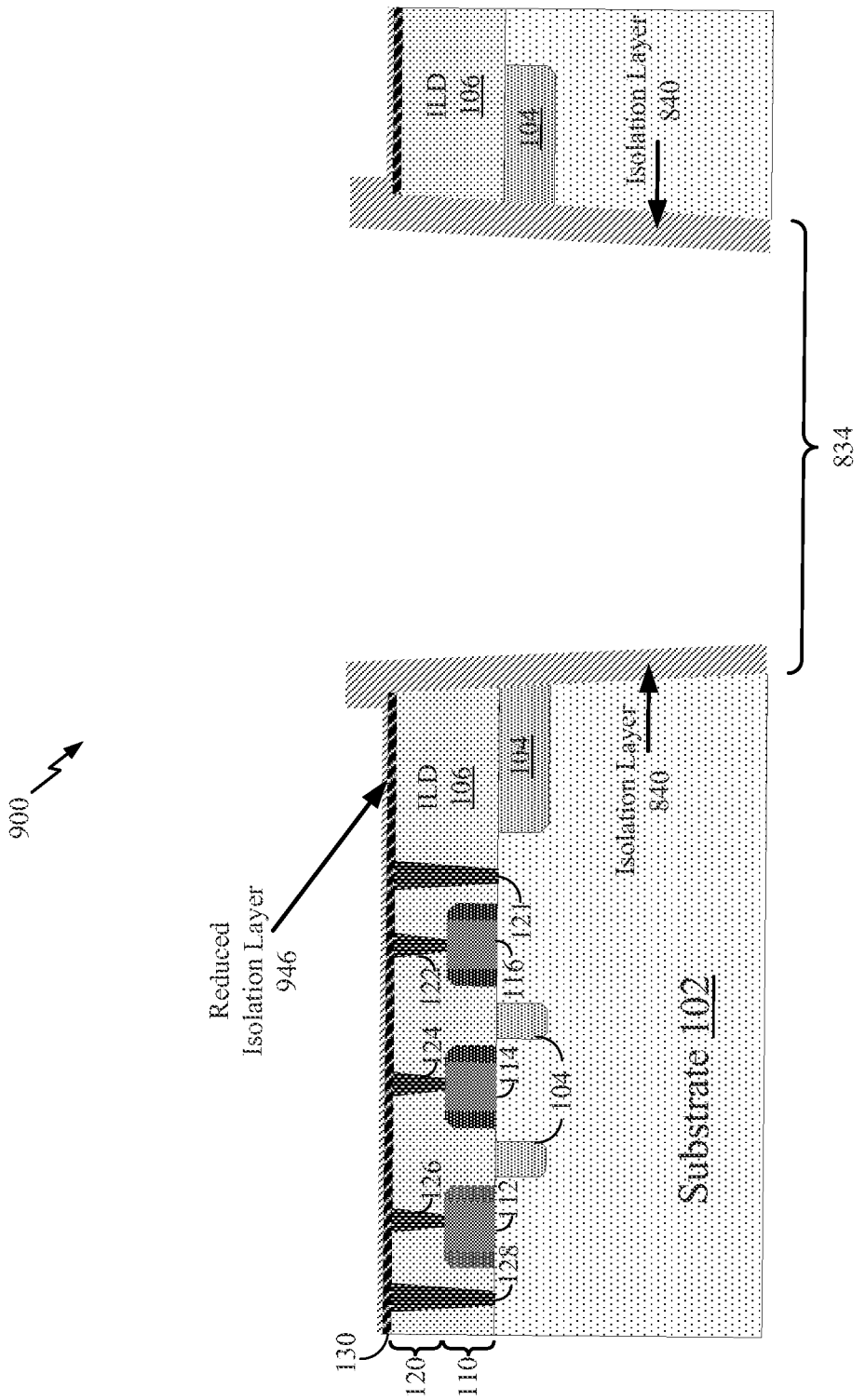
FIG. 9 shows a cross-sectional view illustrating the IC device of FIG. 8, following etching of a field oxide layer and a strip resist to form a reduced isolation layer according to one aspect of the disclosure.

FIG. 8 shows a cross-sectional view illustrating an IC device 800, in which another process is employed. After isolation layer deposition, photoresist 870 is formed over and within a TSV cavity 834 according to one aspect of the disclosure. In another configuration, the photoresist may partially fill the TSV cavity 834. As shown in FIG. 8, an etch 836 of the isolation layer 840 and the photoresist 870 above the TSV cavity 834 is performed. The etch 836 process removes some of the isolation layer 840 that is not under the photoresist 870 (e.g., the isolation layer outside the TSV cavity 834, as shown in FIG. 9). The isolation layer 840 on the sidewalls the TSV cavity 834 is protected by the photoresist 870.

FIG. 9 shows a cross-sectional view illustrating an IC device 900, following partial etching of the isolation layer 840 and removal of the photoresist 870 as shown in FIG. 8, to form a reduced isolation layer 946 according to one aspect of the disclosure. As shown in FIG. 9, the isolation layer that is not within the TSV cavity 834 is reduced on a surface of the substrate 102 to form the reduced isolation layer 946. In one aspect of the disclosure, the reduced isolation layer 946 enables a reduction of a CMP over-polishing when removing the reduced isolation layer 946 and the polish stop layer 130 from the surface of the substrate 102. In this aspect of the disclosure, reducing CMP over-polishing limits the impact on the conductive elements 121-128 of the middle-of-line (MOL) layer 120 of the substrate 102.

Figure 10:
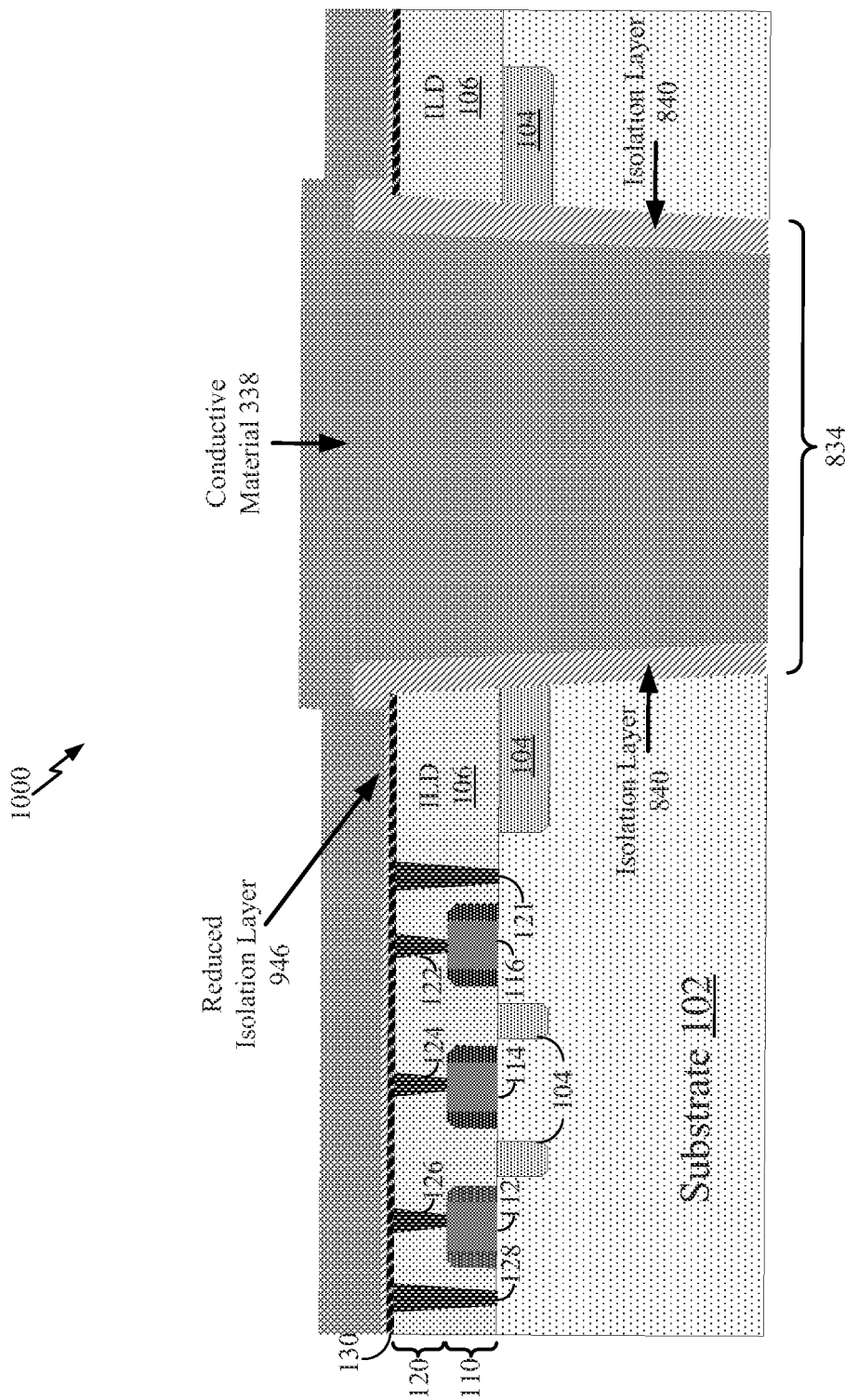
FIG. 10 shows a cross-sectional view illustrating the IC device of FIG. 9, following a TSV barrier seed and copper fill process according to one aspect of the disclosure.

FIG. 10 shows a cross-sectional view illustrating an IC device 1000, following a TSV barrier seed and a conductive material fill process according to one aspect of the disclosure. As shown in FIG. 10, the TSV barrier seed and conductive material fill process fills the TSV cavity 834 with a conductive material 338. In the illustrated example, the conductive material 338 is copper that is also formed on the reduced isolation layer 946. The isolation layer 840 prevents the conductive material 338 within the TSV cavity 834 from contacting the substrate 102. The filler material may include, but is not limited to, copper, tungsten, or other like conductive material.

Figure 11:
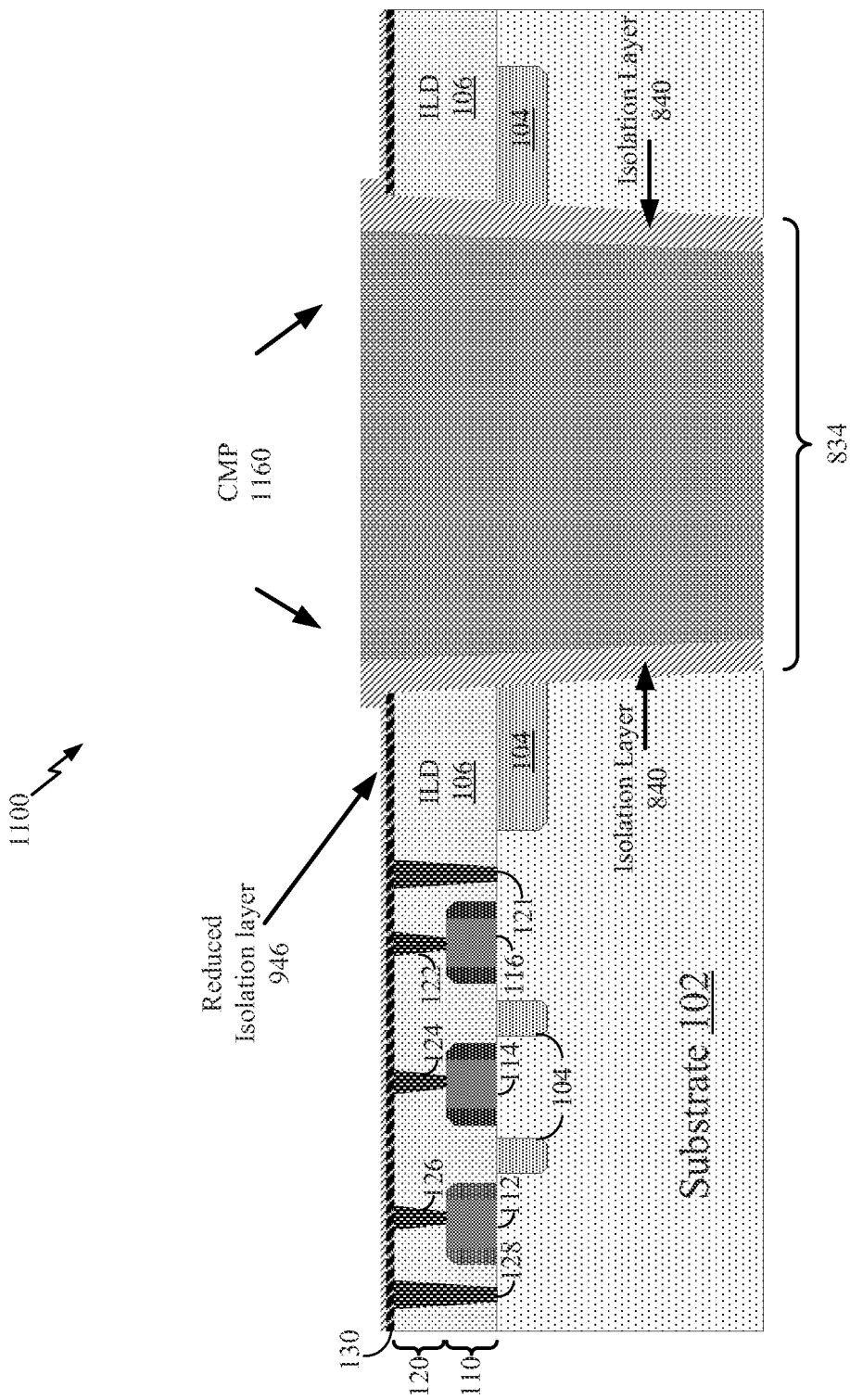
FIG. 11 shows a cross-sectional view illustrating the IC device of FIG. 10, following a copper chemical mechanical polish (CMP) process according to one aspect of the disclosure.

FIG. 11 shows a cross-sectional view illustrating an IC device 1100, following a chemical mechanical polish (CMP) process 1160 according to one aspect of the disclosure. As shown in FIG. 11, the CMP process 1160 removes the conductive material 338 from a surface of the substrate 102. As shown in FIG. 11, the reduced isolation layer 946 and the polish stop layer 130 remain on a surface of the substrate 102. These layers are removed by a CMP over-polishing process, for example, as shown in FIG. 12.

Figure 12:
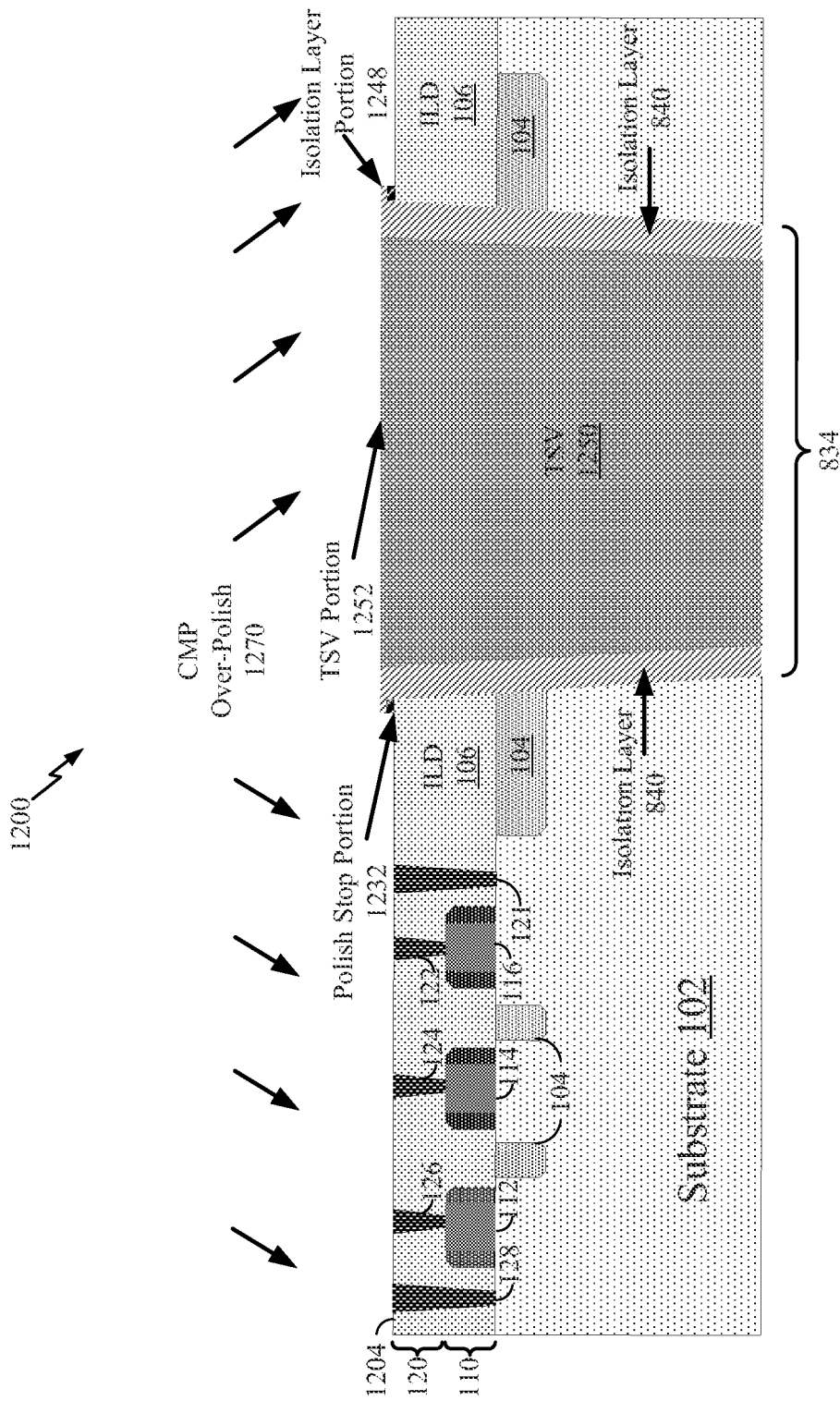
FIG. 12 shows a cross-sectional view illustrating the IC device of FIG. 11, following a chemical mechanical polish (CMP) over-polishing process according to one aspect of the disclosure.

FIG. 12 shows a cross-sectional view illustrating the IC device 1200 of FIG. 11, including a TSV 1250 surrounded by a isolation layer 840 according to one aspect of the disclosure. As shown in FIG. 12, a CMP over-polish process 1270 removes the remaining portion of the isolation layer on a surface 1204 of the substrate 102. Representatively, the CMP over-polish process 1270 removes the reduced isolation layer 946 and the polish stop layer 130 (see FIG. 11) without damaging the MOL portions of the substrate 102. That is, the CMP over-polish process 1270 is shorter and, therefore, has a smaller impact on the conductive elements 121-128 of the MOL layer 120 of the substrate 102 due to the reduced isolation layer 946, as shown in FIGS. 9-11.

As shown in FIG. 12, the CMP over-polish process 1270 completes the formation of a TSV 1250, which includes a TSV portion 1252 that extends above the TSV cavity 834 and over the ILD layer 106. Representatively, a polish stop portion 1232, and an isolation layer portion 1248 of the TSV 1250 extend out of the TSV cavity 834. The CMP over-polish process 1270 removes the reduced isolation layer 946 and the polish stop layer 130 (see FIG. 11) from the surface 1204 of the substrate 102 in preparation for the formation of, for example, an interconnect layer formed through a BEOL process, such as that shown in FIG. 6A.

Figure 13:
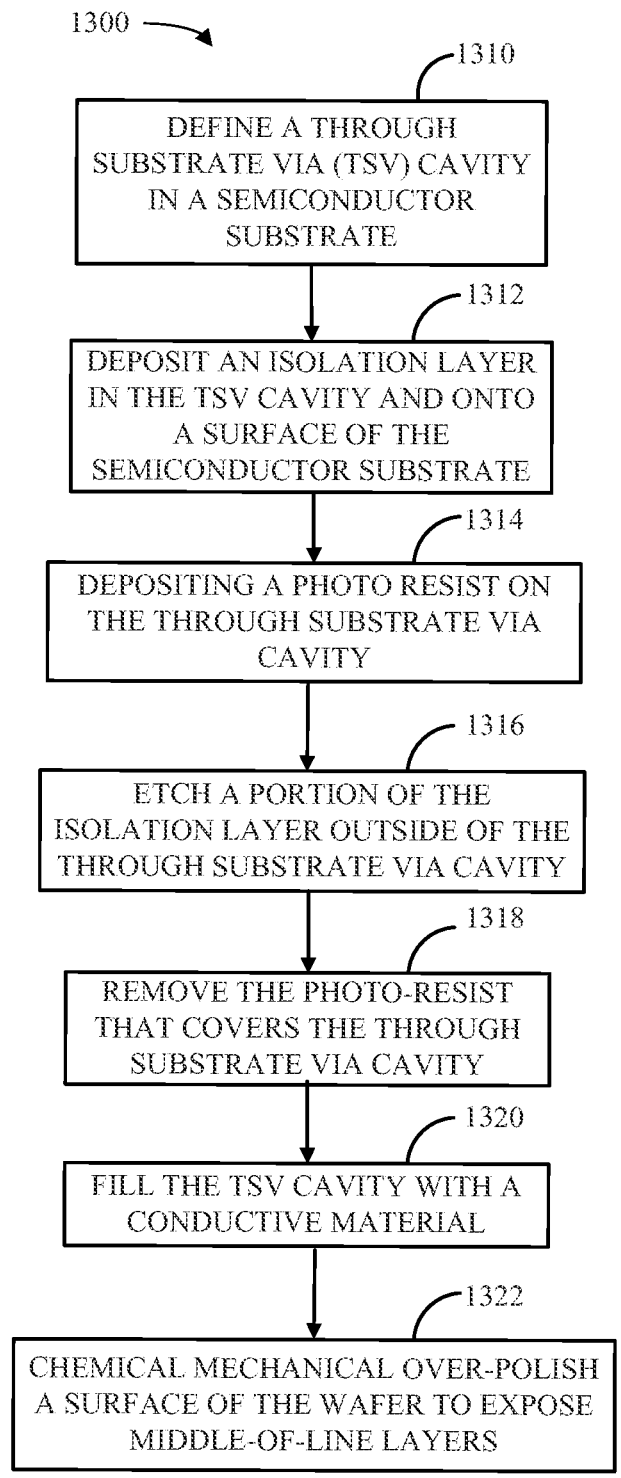
FIG. 13 is a block diagram illustrating a method for integrating through substrate vias (TSVs) into advanced CMOS (complementary metal oxide semiconductor) nodes, according to one aspect of the disclosure.

FIG. 13 is a block diagram illustrating a method 1300 for integrating through substrate vias (TSVs) into advanced CMOS (complementary metal oxide semiconductor) nodes, according to one aspect of the disclosure. At block 1310, a TSV cavity 834 is defined through a substrate and ILD, for example, as shown in FIGS. 8-12. Although the present description has mentioned a silicon substrate, other substrate materials are also contemplated. At block 1312, an isolation layer is deposited in the TSV cavity and on a polish stop layer, for example, as shown in FIG. 8.

Referring again to FIG. 13, at block 1314, the semiconductor substrate is patterned to deposit a photoresist that covers only the through substrate via cavity. For example, as shown in FIG. 8, the photoresist 870 is formed above the TSV cavity 834 and over the isolation layer 840 located on the sidewalk of the TSV cavity 834. At block 1316 the a portion of the isolation layer outside the TSV cavity is etched to form a reduced isolation layer portion. For example, as shown in FIG. 9, etching removes a portion of the isolation layer 840 to form the reduced isolation layer 946. At block 1318, the photoresist that covers the TSV cavity is removed. At block 1320, the TSV cavity 834 is filled with a conductive material 838, for example, as shown in FIG. 10.

Referring again to FIG. 13, at block 1322, a chemical mechanical over-polishing is performed on a surface of the wafer to expose layers created by the MOL process. The chemical mechanical over-polishing removes the conductive material, the isolation layer, and a polish stop layer from the surface of the wafer, as shown in FIGS. 11 and 12. For example, a conductive material bather seed, and etch stop of a CMP process 1160 is performed, as shown in FIG. 11. As seen in FIG. 12, a CMP over-polish process 1270 is performed in which an isolation layer portion 1248, a polish stop portion 1232, and a TSV portion 1252 of the TSV 1250 remain and protrude outside the TSV cavity 834.

In one configuration, the IC device 1200 including a means for conducting through a polish stop layer, an inter-dielectric (ILD) layer, and the substrate. The conducting means has a conductive material. In one aspect of the disclosure, the conducting means is the through substrate via 1250 of FIG. 12, configured to perform the functions recited by the conducting means. In this configuration, the IC device 1200 also includes a means for isolating the conducting means from the semiconductor substrate. The means for isolating may surround the conductive material and partially cover a portion of the polish stop layer. In one aspect of the disclosure, the isolating means is the isolation layer 840, including the polish stop portion 1232 and the isolation layer portion 1248 of FIG. 12, configured to perform the functions recited by the isolating means. In another aspect, the aforementioned means may be a device or any layer configured to perform the functions recited by the aforementioned means.

Figure 14:
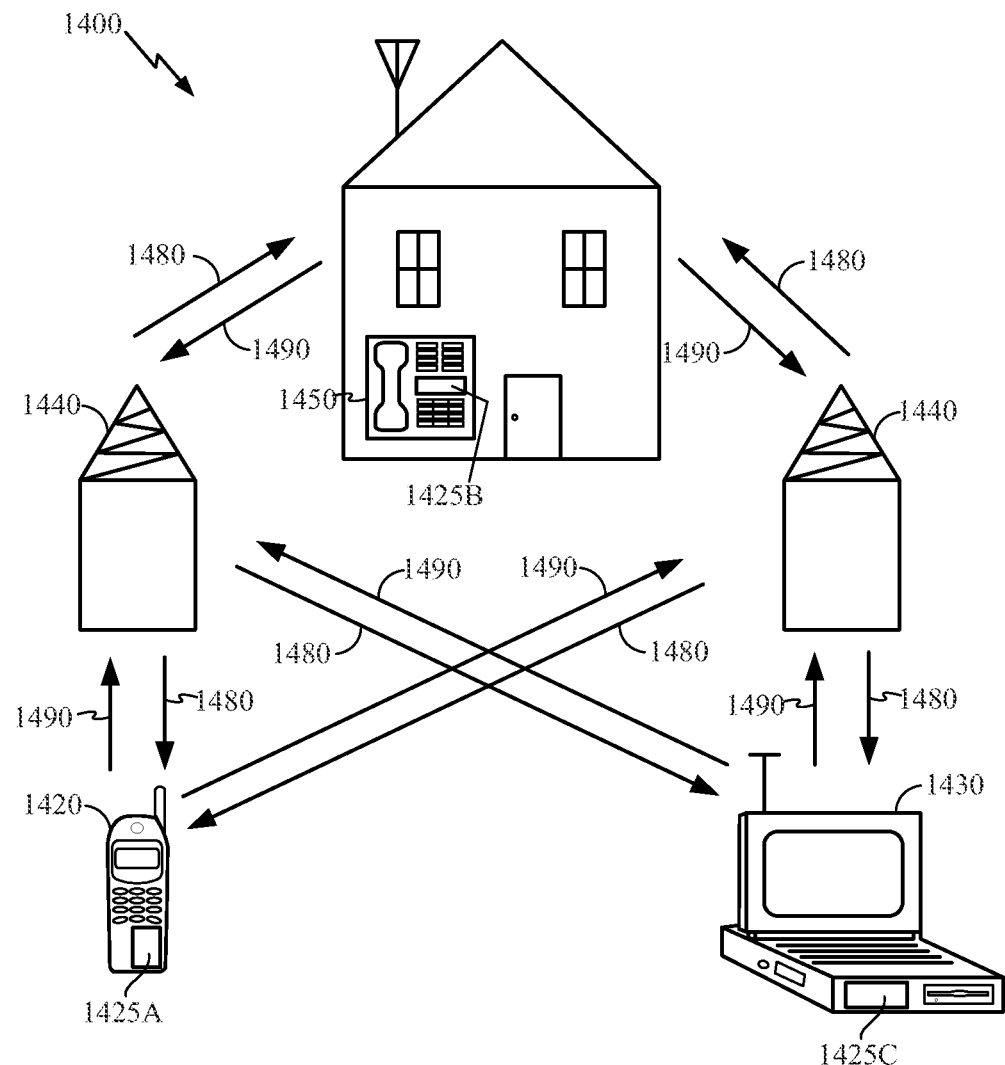
FIG. 14 is a block diagram showing a wireless communication system in which a configuration of the disclosure may be advantageously employed.

FIG. 14 is a block diagram showing an exemplary wireless communication system 1400 in which a configuration of the disclosure may be advantageously employed. For purposes of illustration, FIG. 14 shows three remote units 1420, 1430, and 1450 and two base stations 1440. It will be recognized that wireless communication systems may have many more remote units and base stations. Remote units 1420, 1430, and 1450 include IC devices 1425A, 1425B and 1425C, that include the disclosed through substrate via (TSV) with tapered isolation layer/extra polish stop portion/isolation layer portion. It will be recognized that any device containing an IC may also include a TSAI surrounded by the tapered isolation layer/extra polish stop portion/isolation layer portion disclosed here, including the base stations, switching devices, and network equipment. FIG. 14 shows forward link signals 1480 from the base station 1440 to the remote units 1420, 1430, and 1450 and reverse link signals 1490 from the remote units 1420, 1430, and 1450 to base stations 1440.

In FIG. 14, remote unit 1420 is shown as a mobile telephone, remote unit 1430 is shown as a portable computer, and remote unit 1450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 14 illustrates remote units according to the teachings of the disclosure, the disclosure is not limited to these exemplary illustrated units. Aspects of the present disclosure may be suitably employed in any device which includes a TSV surrounded by a tapered isolation layer/extra polish stop portion/isolation layer portion.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a substrate;
a dielectric layer formed on a first side of the substrate; and
a through substrate via extending through the dielectric layer and the substrate, the through substrate via comprising a conductive material and an isolation layer at least partially surrounding the conductive material, the isolation layer comprising a tapered portion, and wherein the through substrate via further comprises a remnant of a photoresist layer that separates a portion of the conductive material from the isolation layer.

2. The semiconductor device of claim 1, in which the isolation layer comprises a constant portion having a substantially constant diameter and the tapered portion having a varying diameter, the varying diameter being greater than the substantially constant diameter.

3. The semiconductor device of claim 2, in which the conductive material comprises a first portion having a substantially constant diameter and a second portion having a diameter that varies in correspondence with the varying diameter of the tapered portion.

4. The semiconductor device of claim 1, in which the tapered portion of the isolation layer is disposed proximate the first side of the substrate, which has active and/or passive devices.

5. The semiconductor device of claim 1, in which the tapered portion of the isolation layer is disposed proximate the first side of the substrate and the dielectric layer.

6. The semiconductor device of claim 1, in which the through substrate via further comprises a multi-film capping layer that separates the conductive material from the isolation layer.

7. The semiconductor device of claim 1, a portion of which is incorporated into at least one of a music player, a video player, an entertainment unit, a navigation device, a communications device, a personal digital assistant (PDA), a fixed location data unit, and a computer.

8. A semiconductor device, comprising:
a semiconductor substrate;
a dielectric layer formed on a first side of the substrate;
means for conducting through the dielectric layer and the substrate; and
means for isolating the conducting means, the isolating means surrounding the conducting means and comprising a tapered, and wherein the through substrate via further comprises a remnant of a photoresist layer that separates a portion of the conductive material from the isolation layer.

9. The semiconductor device of claim 8, in which a portion of the conducting means varies in diameter based at least in part on the tapered portion of the isolating means.

10. The semiconductor device of claim 8, in which the tapered portion of the isolating means is disposed proximate the first side of the substrate, which has active and/or passive devices.

11. The semiconductor device of claim 8, in which the tapered portion of the isolating means is disposed proximate the first side of the substrate and the dielectric layer.

12. The semiconductor device of claim 8, a portion of which is incorporated into at least one of a music player, a video player, an entertainment unit, a navigation device, a communications device, a personal digital assistant (PDA), a fixed location data unit, and a computer.

* * * * *